(12) United States Patent
Liao et al.

(10) Patent No.: US 9,941,195 B2
(45) Date of Patent: Apr. 10, 2018

(54) VERTICAL METAL INSULATOR METAL CAPACITOR

(71) Applicant: TAIWAN SEMICONDUCTOR MANUFACTURING CO., LTD., Hsinchu (TW)

(72) Inventors: Wen-Shiang Liao, Miaoli County (TW); Chewn-Pu Jou, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 66 days.

(21) Appl. No.: 14/996,070

(22) Filed: Jan. 14, 2016

(65) Prior Publication Data

US 2016/0133686 A1    May 12, 2016

Related U.S. Application Data

(60) Continuation-in-part of application No. 14/600,777, filed on Jan. 20, 2015, now Pat. No. 9,343,237, which
(Continued)

(51) Int. Cl.
  *H01L 23/498* (2006.01)
  *H01G 4/30* (2006.01)
  (Continued)

(52) U.S. Cl.
  CPC ....... *H01L 23/49822* (2013.01); *H01G 4/005* (2013.01); *H01G 4/306* (2013.01);
  (Continued)

(58) Field of Classification Search
  CPC  H01G 4/228; H01G 4/005; H01L 2924/1205; H01L 23/2523
  See application file for complete search history.

(56) References Cited

U.S. PATENT DOCUMENTS

| 5,245,505 A | 9/1993 | Shiga et al. |
| 5,583,359 A | 12/1996 | Ng et al. |

(Continued)

FOREIGN PATENT DOCUMENTS

| TW | 200839990 A | 10/2008 |
| TW | 201104770 A | 2/2011 |

(Continued)

OTHER PUBLICATIONS

OA dated Apr. 1, 2012 from corresponding application No. CN 201010546188.1.
(Continued)

*Primary Examiner* — Earl Taylor
(74) *Attorney, Agent, or Firm* — Maschoff Brennan

(57) ABSTRACT

A semiconductor device and a method are disclosed herein. The semiconductor device includes a device die, a molding layer surrounding the device die, a plurality of first vertical conductive structures formed within the molding layer, and a plurality of second vertical conductive structures formed within the molding layer. The first vertical conductive structures and the second vertical conductive structures are interlaced with each other, and an insulating structure is formed between the first vertical conductive structures and the second vertical conductive structures.

20 Claims, 28 Drawing Sheets

Related U.S. Application Data is a continuation-in-part of application No. 14/337,530, filed on Jul. 22, 2014, now Pat. No. 9,006,061, which is a division of application No. 12/825,605, filed on Jun. 29, 2010, now Pat. No. 8,810,002.

(60) Provisional application No. 61/259,787, filed on Nov. 10, 2009.

(51) Int. Cl.
    *H01G 4/38* (2006.01)
    *H01G 4/005* (2006.01)
    *H01L 49/02* (2006.01)
    *H01L 23/00* (2006.01)
    *H01L 23/538* (2006.01)
    *H01L 23/522* (2006.01)
    *H01L 27/08* (2006.01)

(52) U.S. Cl.
CPC ............ *H01G 4/38* (2013.01); *H01L 23/5389* (2013.01); *H01L 24/19* (2013.01); *H01L 28/60* (2013.01); *H01L 23/49816* (2013.01); *H01L 23/49827* (2013.01); *H01L 23/5223* (2013.01); *H01L 24/32* (2013.01); *H01L 24/73* (2013.01); *H01L 24/83* (2013.01); *H01L 24/92* (2013.01); *H01L 27/0805* (2013.01); *H01L 28/90* (2013.01); *H01L 2224/04105* (2013.01); *H01L 2224/12105* (2013.01); *H01L 2224/24195* (2013.01); *H01L 2224/32225* (2013.01); *H01L 2224/32245* (2013.01); *H01L 2224/73267* (2013.01); *H01L 2224/83005* (2013.01); *H01L 2224/92244* (2013.01); *H01L 2924/19041* (2013.01); *H01L 2924/19105* (2013.01)

(56) References Cited

U.S. PATENT DOCUMENTS

| | | | | |
|---|---|---|---|---|
| 5,726,493 | A * | 3/1998 | Yamashita | H01L 23/3128 257/686 |
| 6,251,740 | B1 * | 6/2001 | Johnson | H01L 21/76838 257/E21.008 |
| 6,297,524 | B1 | 10/2001 | Vathulya et al. | |
| 6,329,234 | B1 | 12/2001 | Ma et al. | |
| 6,410,954 | B1 | 6/2002 | Sowlati et al. | |
| 6,417,535 | B1 * | 7/2002 | Johnson | H01L 23/5223 257/296 |
| 6,441,419 | B1 | 8/2002 | Johnson et al. | |
| 6,504,202 | B1 * | 1/2003 | Allman | H01L 28/40 257/303 |
| 6,524,940 | B2 | 2/2003 | Verhaverbeke et al. | |
| 6,570,210 | B1 | 5/2003 | Sowlati et al. | |
| 6,635,916 | B2 | 10/2003 | Aton | |
| 6,740,922 | B2 | 5/2004 | Jones et al. | |
| 6,743,671 | B2 | 6/2004 | Hu et al. | |
| 6,746,914 | B2 | 6/2004 | Kai et al. | |
| 6,822,312 | B2 | 11/2004 | Sowlati et al. | |
| 6,897,505 | B2 | 5/2005 | Aton | |
| 6,974,994 | B1 | 12/2005 | Kuo et al. | |
| 7,180,160 | B2 | 2/2007 | Ferrant et al. | |
| 7,185,426 | B1 * | 3/2007 | Hiner | H01L 21/4857 257/687 |
| 7,187,015 | B2 | 3/2007 | Tsau | |
| 7,298,001 | B1 | 11/2007 | Liu et al. | |
| 7,348,624 | B2 | 3/2008 | Sakaguchi et al. | |
| 7,385,241 | B2 | 6/2008 | Choi | |
| 7,446,390 | B2 | 11/2008 | Okuda et al. | |
| 7,466,534 | B2 | 12/2008 | Chinthakindi | |
| 7,485,912 | B2 | 2/2009 | Wang | |
| 7,485,914 | B2 | 2/2009 | Huang et al. | |
| 7,518,850 | B2 | 4/2009 | Kim et al. | |
| 7,551,421 | B2 | 6/2009 | Thompson et al. | |
| 7,579,643 | B2 | 8/2009 | Oh et al. | |
| 7,635,887 | B2 | 12/2009 | Steltenpohl | |
| 7,643,268 | B2 | 1/2010 | Chinthakindi | |
| 7,662,695 | B2 | 2/2010 | Choi | |
| 7,663,175 | B2 | 2/2010 | Komura et al. | |
| 7,667,256 | B2 | 2/2010 | Hommel et al. | |
| 7,714,371 | B2 | 5/2010 | Paul et al. | |
| 7,741,670 | B2 | 6/2010 | Pan | |
| 7,768,054 | B2 | 8/2010 | Benetik et al. | |
| 7,768,055 | B2 | 8/2010 | Chinthakindi et al. | |
| 7,859,825 | B2 | 12/2010 | Kim et al. | |
| 7,863,662 | B2 | 1/2011 | Sato et al. | |
| 7,866,015 | B2 | 1/2011 | Chinthakindi | |
| 8,012,797 | B2 * | 9/2011 | Shen | H01L 21/4853 438/107 |
| 8,134,195 | B2 | 3/2012 | Lee et al. | |
| 8,138,539 | B2 | 3/2012 | Barth et al. | |
| 8,169,014 | B2 | 5/2012 | Chen et al. | |
| 8,207,567 | B2 | 6/2012 | Chin et al. | |
| 8,217,502 | B2 * | 7/2012 | Ko | H01L 23/49827 257/686 |
| 8,258,600 | B2 | 9/2012 | Sugisaki et al. | |
| 8,269,337 | B2 | 9/2012 | Hu et al. | |
| 8,372,741 | B1 * | 2/2013 | Co | H01L 24/03 219/56.22 |
| 8,404,520 | B1 * | 3/2013 | Chau | H01L 23/49517 228/155 |
| 8,680,684 | B2 * | 3/2014 | Haba | H01L 24/20 257/774 |
| 8,836,114 | B2 | 9/2014 | Oh et al. | |
| 8,878,353 | B2 * | 11/2014 | Haba | H01L 23/528 257/686 |
| 9,006,888 | B2 | 4/2015 | Shim et al. | |
| 9,136,254 | B2 * | 9/2015 | Zhao | H01L 24/43 |
| 9,165,793 | B1 * | 10/2015 | Wang | H01L 21/56 |
| 9,224,717 | B2 * | 12/2015 | Sato | H01L 23/13 |
| 9,459,224 | B1 * | 10/2016 | Cheng | H01L 28/60 |
| 9,558,965 | B2 | 1/2017 | Chi et al. | |
| 2002/0047154 | A1 | 4/2002 | Sowlati et al. | |
| 2003/0042564 | A1 * | 3/2003 | Taniguchi | H01L 23/3128 257/438 |
| 2003/0211731 | A1 | 11/2003 | Kai et al. | |
| 2004/0138050 | A1 | 7/2004 | Wang et al. | |
| 2004/0164339 | A1 | 8/2004 | Felsner et al. | |
| 2005/0133848 | A1 | 6/2005 | Rotella | |
| 2006/0054994 | A1 * | 3/2006 | Harris | H01L 23/5223 257/532 |
| 2006/0086965 | A1 | 4/2006 | Sakaguchi et al. | |
| 2006/0255449 | A1 * | 11/2006 | Lee | H01L 23/04 257/698 |
| 2007/0071052 | A1 | 3/2007 | Hommel et al. | |
| 2007/0123015 | A1 * | 5/2007 | Chinthakindi | H01L 23/5227 438/597 |
| 2007/0241463 | A1 * | 10/2007 | Yamaguchi | H01L 21/4846 257/777 |
| 2007/0279835 | A1 * | 12/2007 | Chinthakindi | H01G 4/228 361/306.2 |
| 2008/0073769 | A1 * | 3/2008 | Wu | H01L 21/56 257/686 |
| 2008/0180878 | A1 * | 7/2008 | Wang | H01G 4/228 361/306.3 |
| 2008/0197399 | A1 | 8/2008 | Hsu et al. | |
| 2008/0237828 | A1 | 10/2008 | Yang | |
| 2009/0045523 | A1 * | 2/2009 | Fan | H01L 25/105 257/777 |
| 2009/0091026 | A1 * | 4/2009 | Fan | H05K 3/3436 257/737 |
| 2009/0102030 | A1 * | 4/2009 | Khan | H01L 21/56 257/675 |
| 2009/0141424 | A1 | 6/2009 | Barth et al. | |
| 2009/0305464 | A1 * | 12/2009 | Howard | H01L 23/3121 438/109 |
| 2010/0012989 | A1 | 1/2010 | Lee et al. | |
| 2010/0117218 | A1 * | 5/2010 | Park | H01L 21/563 257/693 |
| 2010/0171205 | A1 * | 7/2010 | Chen | H01L 21/565 257/686 |

(56) References Cited

U.S. PATENT DOCUMENTS

| | | | | | |
|---|---|---|---|---|---|
| 2010/0230806 | A1* | 9/2010 | Huang | .................... | H01L 23/50 257/723 |
| 2010/0284125 | A1* | 11/2010 | Moon | .................... | B82Y 10/00 361/305 |
| 2011/0057308 | A1* | 3/2011 | Choi | .................... | H01L 23/3121 257/737 |
| 2011/0108950 | A1 | 5/2011 | Jou et al. | | |
| 2011/0115081 | A1* | 5/2011 | Osumi | ............... | H01L 23/49811 257/737 |
| 2011/0140259 | A1* | 6/2011 | Cho | ................. | H01L 25/16 257/686 |
| 2011/0241168 | A1* | 10/2011 | Kim | .................... | H01L 25/0657 257/532 |
| 2011/0254132 | A1* | 10/2011 | Cho | ................. | H01G 4/232 257/534 |
| 2012/0015481 | A1* | 1/2012 | Kim | .................... | H01L 21/565 438/108 |
| 2012/0018198 | A1* | 1/2012 | Furutani | ................. | H01G 4/224 174/255 |
| 2012/0020026 | A1* | 1/2012 | Oganesian | .......... | H01L 23/5389 361/707 |
| 2012/0080787 | A1* | 4/2012 | Shah | ................. | H01L 21/4853 257/737 |
| 2012/0092806 | A1* | 4/2012 | Hua | .................... | H01L 23/5223 361/306.3 |
| 2012/0104606 | A1* | 5/2012 | Okuda | ................. | H01L 21/565 257/738 |
| 2012/0126416 | A1* | 5/2012 | Lee | ................. | H01L 21/563 257/774 |
| 2012/0273960 | A1* | 11/2012 | Park | .................... | H01L 21/4846 257/774 |
| 2012/0280386 | A1* | 11/2012 | Sato | .................... | H01L 23/3121 257/737 |
| 2012/0319295 | A1* | 12/2012 | Chi | ................. | H01L 21/561 257/774 |
| 2013/0049218 | A1* | 2/2013 | Gong | ................. | H01L 24/19 257/774 |
| 2013/0056853 | A1* | 3/2013 | Cho | .................... | H01L 23/5223 257/534 |
| 2013/0069222 | A1* | 3/2013 | Camacho | .......... | H01L 23/49827 257/737 |
| 2013/0093045 | A1* | 4/2013 | Cho | .................... | H01L 23/5223 257/531 |
| 2013/0182402 | A1* | 7/2013 | Chen | ................. | H01L 23/49827 361/807 |
| 2013/0228894 | A1* | 9/2013 | Yen | .................... | H01L 23/5223 257/532 |
| 2013/0328142 | A1* | 12/2013 | Nackaerts | ............... | H01L 29/84 257/415 |
| 2014/0021583 | A1* | 1/2014 | Lo | .................... | H01L 23/49816 257/532 |
| 2014/0036454 | A1* | 2/2014 | Caskey | ............... | H05K 1/0298 361/735 |
| 2014/0124949 | A1* | 5/2014 | Paek | .................... | H01L 25/105 257/774 |
| 2014/0220744 | A1* | 8/2014 | Damberg | .............. | H01L 25/105 438/127 |
| 2015/0017765 | A1* | 1/2015 | Co | .................... | H01L 23/5389 438/126 |
| 2015/0346132 | A1* | 12/2015 | Morosow | ............. | G01N 27/223 73/335.04 |
| 2016/0133686 | A1* | 5/2016 | Liao | .................... | H01L 23/5389 257/532 |

FOREIGN PATENT DOCUMENTS

| | | | | |
|---|---|---|---|---|
| TW | 201140792 A | 11/2011 | | |
| TW | 201216390 A | 4/2012 | | |
| TW | 201225762 A | 6/2012 | | |
| WO | WO 2016053469 A1 * | 4/2016 | ......... | H01L 25/0657 |

OTHER PUBLICATIONS

Wang, "Chemical Vapor Deposition of Thin Films for ULSI Interconnect Metallization, Disertation," http://etd.lsu.edu/docs/available/edt-04042005-171306/unrestricted/Wang_dis.pdf, May 2005.

W.S. Liao al ET, "A manufacturable interposer MIM decoupling capacitor with robust thin high-K dielectric for heterogeneous 3D IC CoWoS wafer level system integration", 2014, IEEE.

* cited by examiner

VERTICAL METAL INSULATOR METAL CAPACITOR

REFERENCE TO RELATED APPLICATION

This application is a continuation-in-part of U.S. application Ser. No. 14/600,777 filed on Jan. 20, 2015, which is a continuation-in-part of U.S. application Ser. No. 14/337,530, filed on Jul. 22, 2014, which is a division and claims priority of U.S. application Ser. No. 12/825,605, filed on Jun. 29, 2010, which claims priority of U.S. Provisional Patent Application No. 61/259,787, filed on Nov. 10, 2009, which are incorporated herein by reference in their entireties.

BACKGROUND

Capacitors are widely used in integrated circuits. The capacitance of a capacitor is proportional to the capacitor area and the dielectric constant (k) of the insulation layer, and is inversely proportional to the thickness of the insulation layer. Therefore, to increase the capacitance, it is preferable to increase the area and k value and to reduce the thickness of the insulation layer.

A problem associated with the increased area is that a greater chip area is required. Conventional metal-insulator-metal (MIM) capacitors in integrated circuits have various horizontal comb structures. The horizontal structure capacitance correlates with inter-metal layer thickness. However, the thickness of an inter-metal layer is very difficult to control. This results in high variation of MIM capacitance in production for a target value. Accordingly, new methods and structures are desired for MIM capacitors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
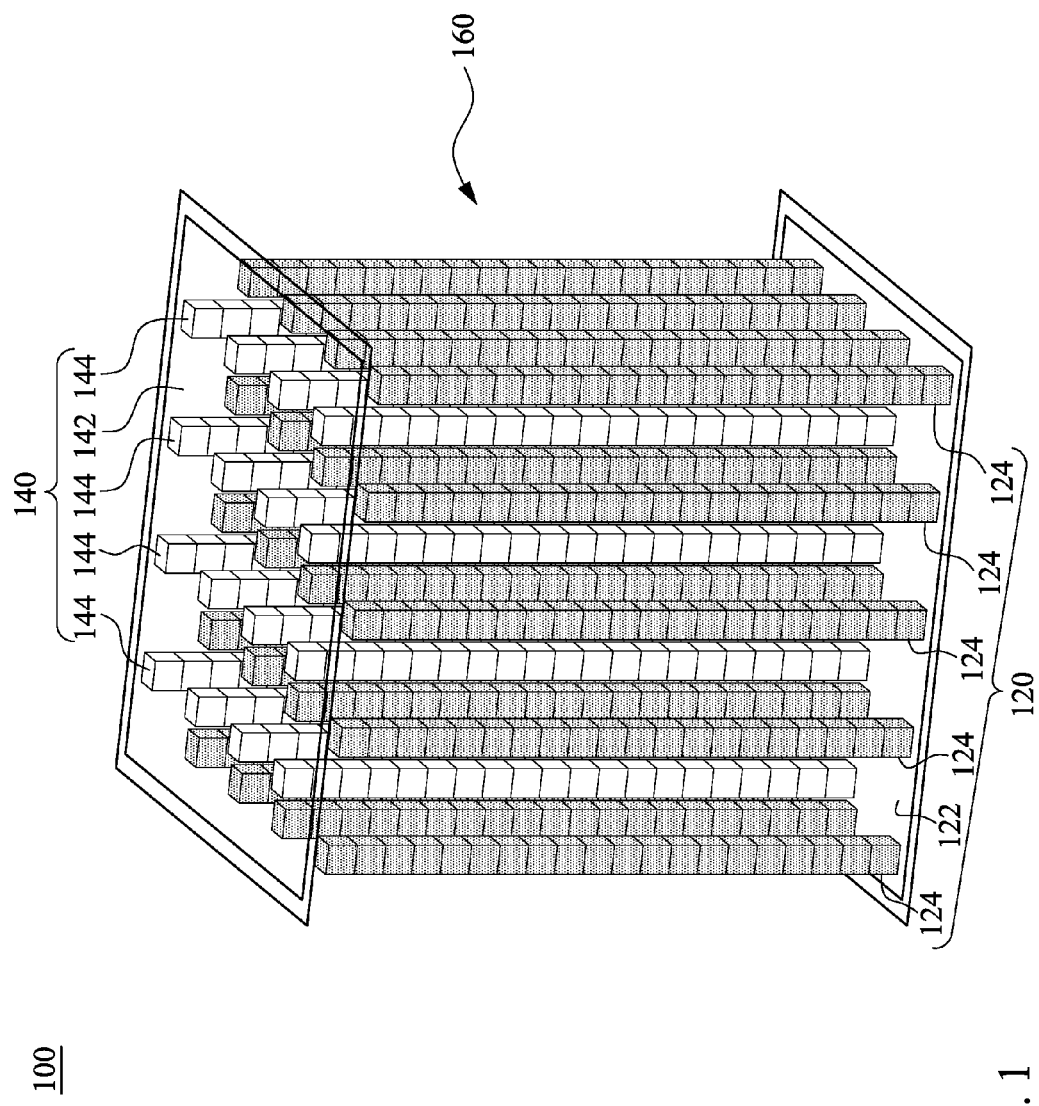
FIG. 1 is a schematic diagram illustrating a semiconductor structure having a vertical capacitor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

FIG. 1 is a schematic diagram illustrating a semiconductor structure 100 including a vertical capacitor in accordance to some embodiments of the present disclosure.

As illustratively shown in FIG. 1, the semiconductor structure 100 includes electrodes 120 and 140. The electrode 120 includes a conductive plane 122 and vertical conductive structures 124. The electrode 140 includes a conductive plane 142 and vertical conductive structures 144. The vertical conductive structures 124 and the vertical conductive structures 144 are interlaced with each other, and a dielectric material 160 is filled between the electrode 120 and the electrode 140.

The conductive plane 122 and the conductive plane 142 include conductive material, including, for example, copper, silver, gold, and the like. In some embodiments, the conductive plane 122 and the conductive plane 142 include other suitable conductive material other than metal.

Figure 2:
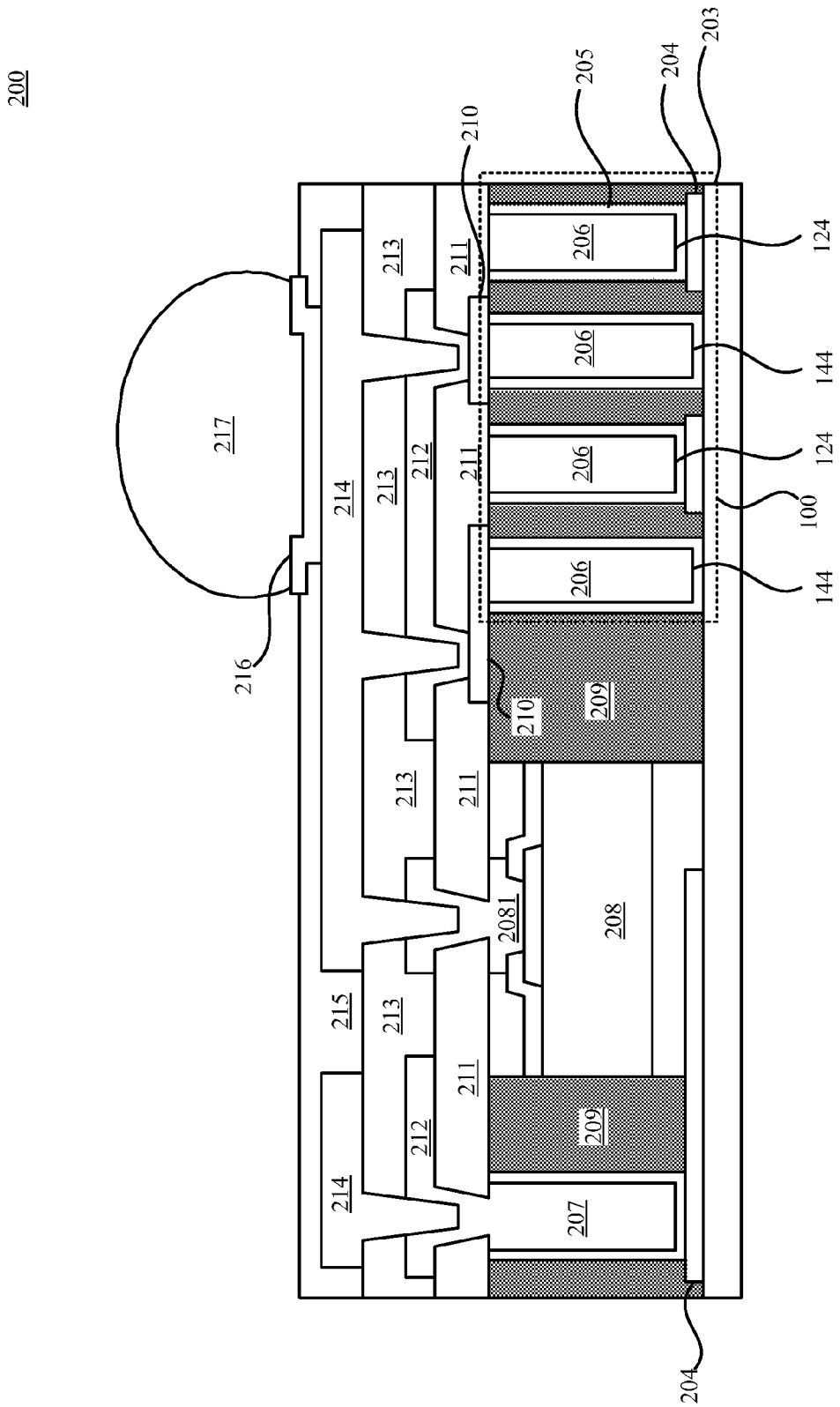
FIG. 2 is a schematic diagram illustrating an integrated Fan-Out (InFO) package including the semiconductor structure in FIG. 1 in accordance with some embodiments of the present disclosure.

Reference is made to FIG. 2. FIG. 2 is a schematic diagram illustrating an integrated Fan-Out (InFO) package 200 including the semiconductor structure 100 as illustrated in FIG. 1 in accordance with some embodiments of the present disclosure. With respect to the embodiments of FIG. 1, like elements in FIG. 2 are designated with the same reference numbers for ease of understanding.

For illustration, the package 200 includes a polymer base layer 203, an InFO backside redistribution layer (RDL) 204, a seed layer 205, a conductive material 206, conductive through molding via (TMV) 207, a device die 208, a molding layer 209, a conductive layer 210, polymer layers 211, 213, and 215, redistribution layers (RDLs) 212 and 214, Under Bump Metallurgies (UBMs) 216, and an external connectors 217.

As illustratively shown in FIG. 2, in some embodiments, the semiconductor structure 100 shown in FIG. 1 is formed in the integrated Fan-Out (InFO) package 200. Since the semiconductor structure 100 is fabricated simultaneously with other features of the package 200, the manufacturing cost is relatively low.

For illustration, the semiconductor structure 100 includes vertical conductive structures 124 formed within the molding layer 209 and electrically coupled to the conductive plane 122, and vertical conductive structures 144 formed within the molding layer 209 and electrically coupled to the conductive plane 142. The conductive plane 142 is disposed over the molding layer 209. The vertical conductive structures 124 and 144 are formed by the conductive material 206 overlying the seed layer 205, which is filled within the through molding vias (TMVs) extending through the molding compound (MC). The conductive plane 122 is formed within the InFO backside RDL 204. The conductive plane 142 is formed within the RDL 212, and the device die 208 and the conductive plane 142 are electrically coupled via the RDL 214.

In some embodiments, the vertical conductive structures 124 and the vertical conductive structures 144 have a square shape, a rectangular shape, a circular shape, an oval shape, any other suitable shape in a cross section, or any combinations thereof. The vertical conductive structures 124 are distributed uniformly on the conductive plane 122, and the vertical conductive structures 144 are distributed uniformly under the conductive plane 142. In some embodiments, the vertical conductive structures 124 are distributed in a square grid pattern on the conductive plane 122, and the vertical conductive structures 144 are distributed in a square grid pattern under the conductive plane 142.

In some embodiments, the molding compound MC is applied in the molding layer 209 to surround the device die 208, the vertical conductive structures 124 and the vertical conductive structures 144 on the polymer base layer 203. Alternatively stated, in some embodiments, the molding compound MC in the integrated Fan-Out (InFO) package 200 is filled between the vertical conductive structures 124 and the vertical conductive structures 144 as the dielectric material 160 shown in FIG. 1. In some embodiments, the molding compound MC includes high-k polymer or silica.

In some embodiments, the polymer layer 211 overlies the molding layer 209. The RDL 212 overlies the polymer layer 211. The polymer layer 213 overlies the RDL 212. The RDL 214 overlies the polymer layer 213. The polymer layer 215 overlies the RDL 214. The Under Bump Metallurgies (UBMs) 216 are formed over the RDL 214. The external connectors 217 are disposed on the UBMs 216 and configured to be the input/output (I/O) pads, including, for example, solder balls, to electrically connect to the device die 208 through the RDL 214. In some embodiments, the external connectors 217 are ball grid array (BGA) balls, controlled collapse chip connector (C4) bumps, or the like. In some embodiments, the connectors 217 are used to electrically connect package 200 to other package components including, for example, another device die, interposers, package substrates, printed circuit boards, a mother board, or the like.

Figure 3:
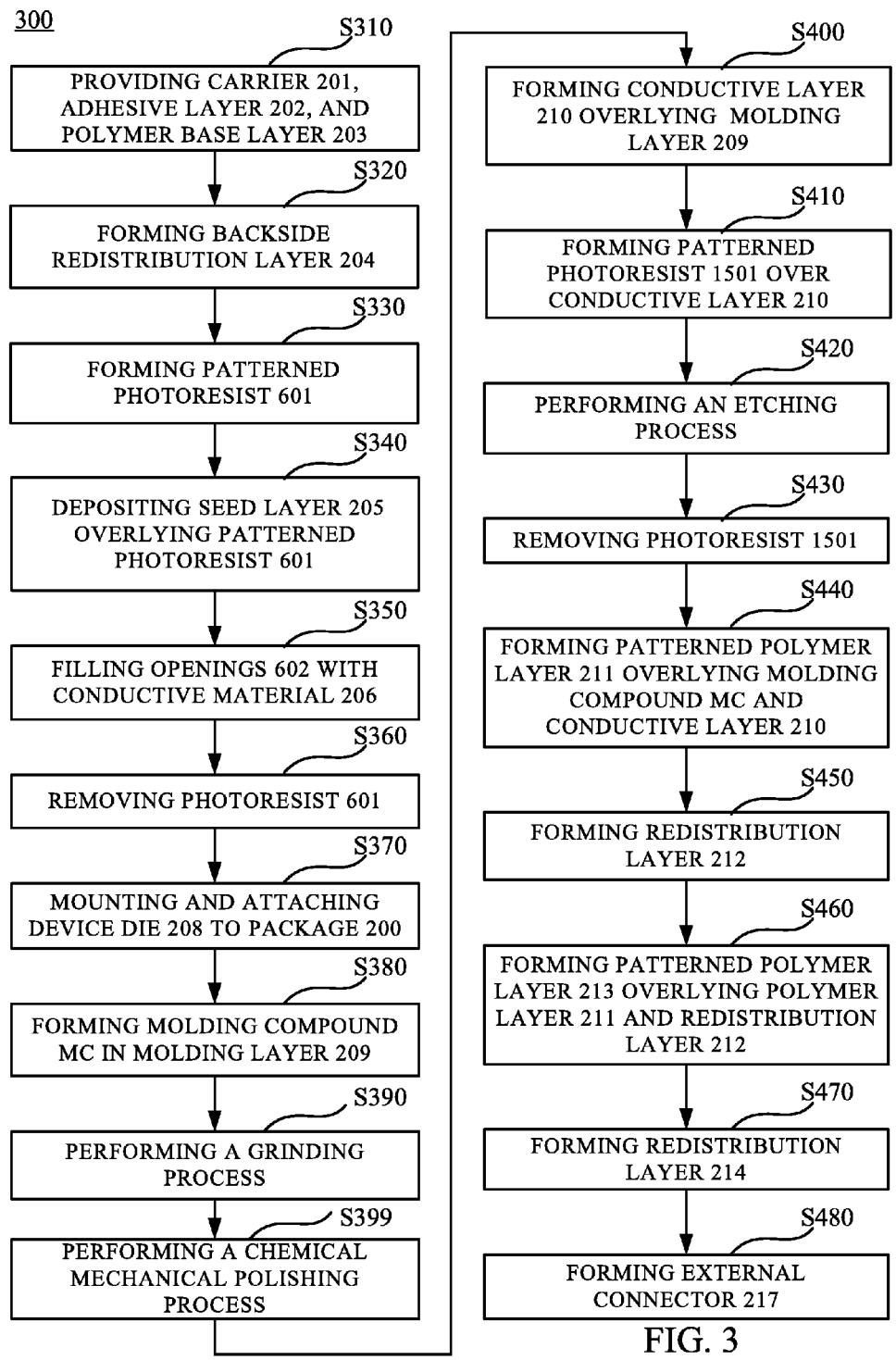
FIG. 3 is a flow chart illustrating a method for fabricating the semiconductor structure in FIG. 2 in accordance with some embodiments of the present disclosure.

FIG. 3 is a flowchart illustrating a method 300 of forming the Integrated Fan-Out (InFO) package 200 as illustrated in FIG. 2, in accordance with some embodiments of the present disclosure. For better understanding of the present disclosure, the method 300 is discussed in relation to the semiconductor structure 100 shown in FIGS. 1-2, but is not limited thereto.

For illustration, the manufacturing process of the Integrated Fan-Out (InFO) package 200 illustrated in FIG. 2 is described by the method 300 together with FIGS. 4-19. FIGS. 4-19 are cross sectional views of the Integrated Fan-Out (InFO) package 200 at different stages of the manufacturing process, in accordance with some embodiments of the present disclosure. After the different stages in FIGS. 4-19, the package 200 has the cross sectional view in FIG. 2. Although FIGS. 4-19 are described together with the method 300, it will be appreciated that the structures disclosed in FIGS. 4-19 are not limited to the method 300. Like elements in FIGS. 4-19 are designated with the same reference numbers for ease of understanding.

While disclosed methods are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 4:
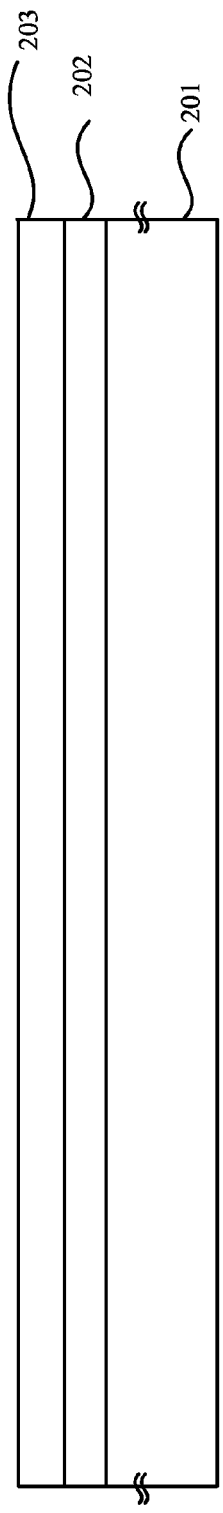
FIGS. 4-19 are cross sectional views of the package in FIG. 2 at different stages of a manufacturing process, in accordance with some embodiments of the present disclosure.

With reference to the method 300 in FIG. 3, in operation S310, the carrier 201, the adhesive layer 202, and the polymer base layer 203 are provided, as illustrated in FIG. 4.

In some embodiments, the carrier 201 includes glass, ceramic, or other suitable material to provide structural support during the formation of various features in device package. In some embodiments, the adhesive layer 202, including, for example, a glue layer, a light-to-heat conversion (LTHC) coating, an ultraviolet (UV) film or the like, is disposed over the carrier 201. The polymer base layer 203 is coated on the carrier 201 via the adhesive layer 202. In some embodiments, the carrier 201 and the adhesive layer 202 are removed from the InFO package after the packaging process. In some embodiments, the polymer base layer 203 is formed of PolyBenzOxazole (PBO), Ajinomoto Buildup Film (ABF), polyimide, BenzoCycloButene (BCB), Solder Resist (SR) film, Die-Attach Film (DAF), or the like, but the present disclosure is not limited thereto.

Figure 5:
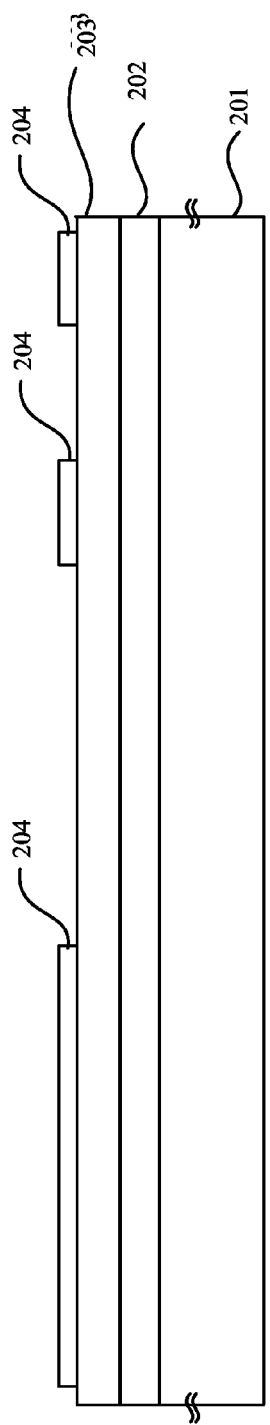

With reference to the method 300 in FIG. 3, in operation S320, subsequently, the InFO backside redistribution layer (RDL) 204 is formed, as illustrated in FIG. 5. In some embodiments, the backside RDL 204 includes conductive features, including, for example, conductive lines and/or vias, formed in one or more polymer layers. In some embodiments, the polymer layers are formed of any suitable material, including PI, PBO, BCB, epoxy, silicone, acrylates, nano-filled pheno resin, siloxane, a fluorinated polymer, polynorbornene, or the like, using any suitable method, including, for example, a spin-on coating technique, sputtering, and the like.

In some embodiments, the conductive features are formed in polymer layers. The formation of such conductive features includes patterning polymer layers, for example, using a combination of photolithography and etching processes, and forming the conductive features in the patterned polymer layers, for example, depositing a seed layer (i.e., TiCu) and then plating a conductive metal layer (i.e., Cu) and using a mask layer to define the shape of the conductive features. For illustration, some conductive features are designed to form the conductive plane 122 of the semiconductor structure 100, and some other conductive features are designed to form functional circuits and input/output features for subsequently attached dies.

Figure 6:
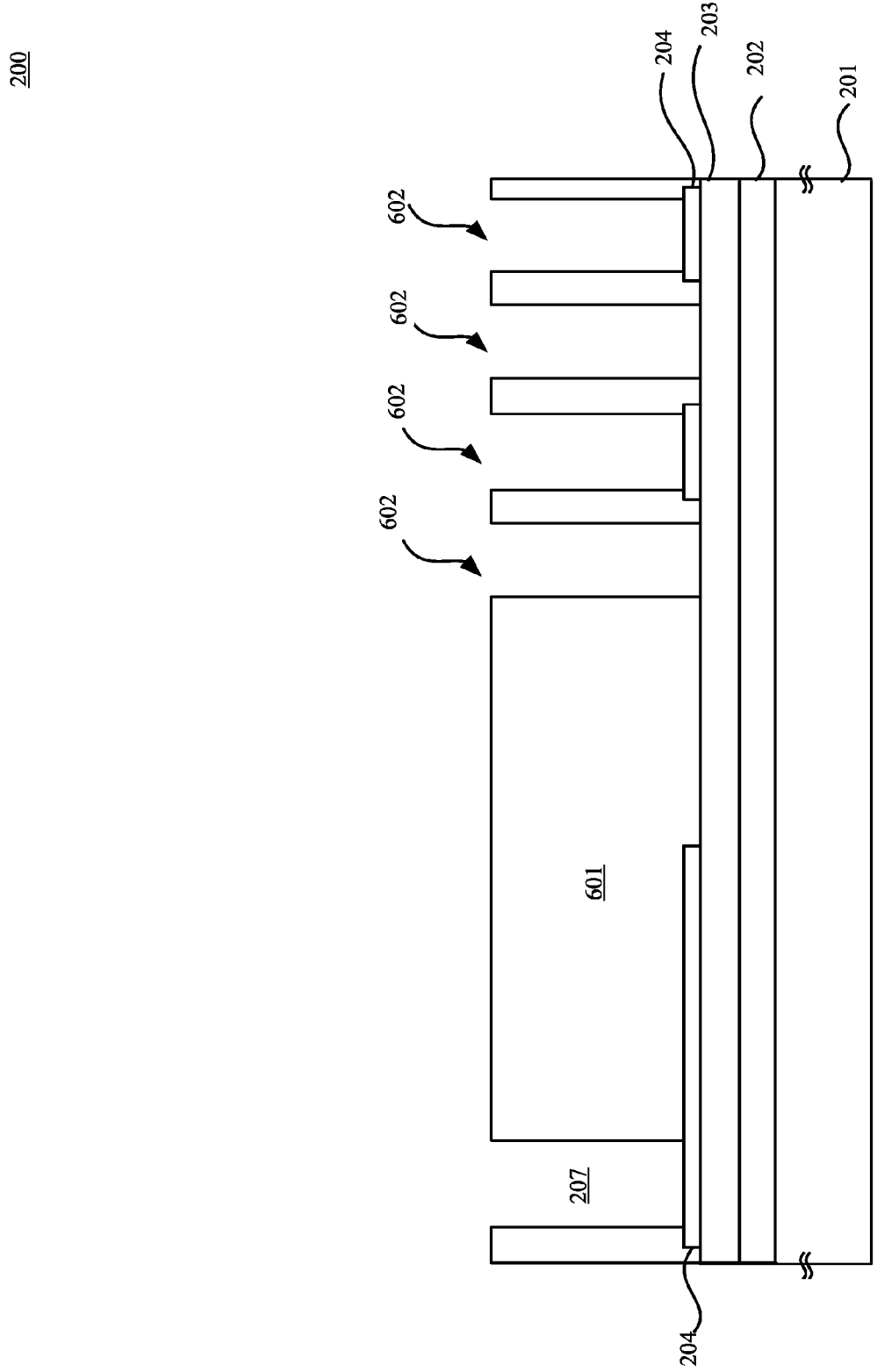

Next, in operation S330, a patterned photoresist 601 is formed over the InFO backside RDL 204 and the carrier 201, as illustrated in FIG. 6. In some embodiments, for example, photoresist 601 is deposited as a blanket layer over the backside RDL 204. Next, portions of photoresist 601 are exposed using a photo mask (not shown). Exposed or unexposed portions of photoresist 601 are then removed depending on whether a negative or positive resist is used. The resulting patterned photoresist 601 includes openings 602 disposed at peripheral areas of the carrier 201. In some embodiments, the openings 602 further expose conductive features in the backside RDL 204.

Figure 7:
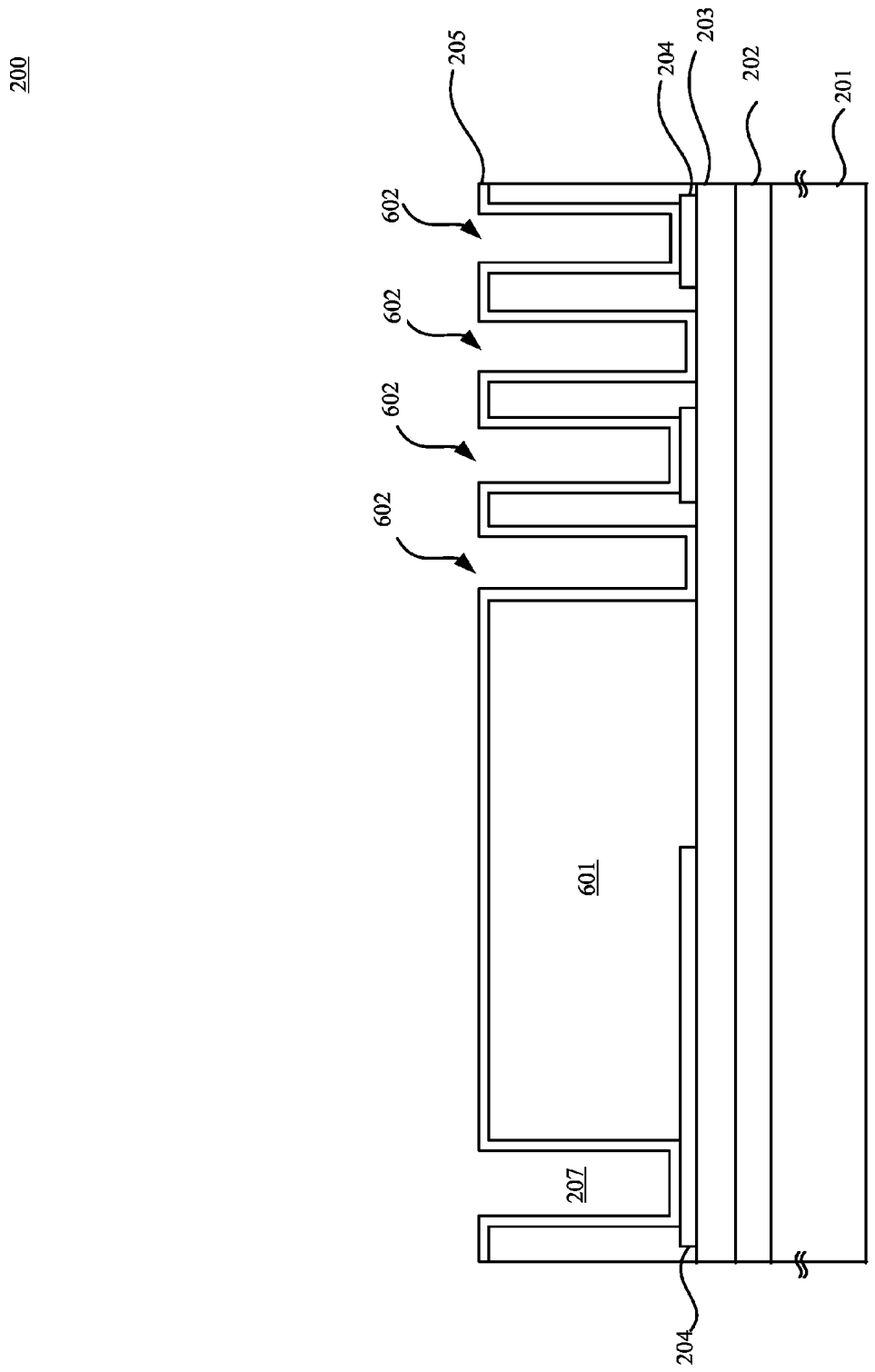

Next, in operation S340, the seed layer 205 is deposited overlying the patterned photoresist 601, as illustrated in FIG. 7.

Figure 8:
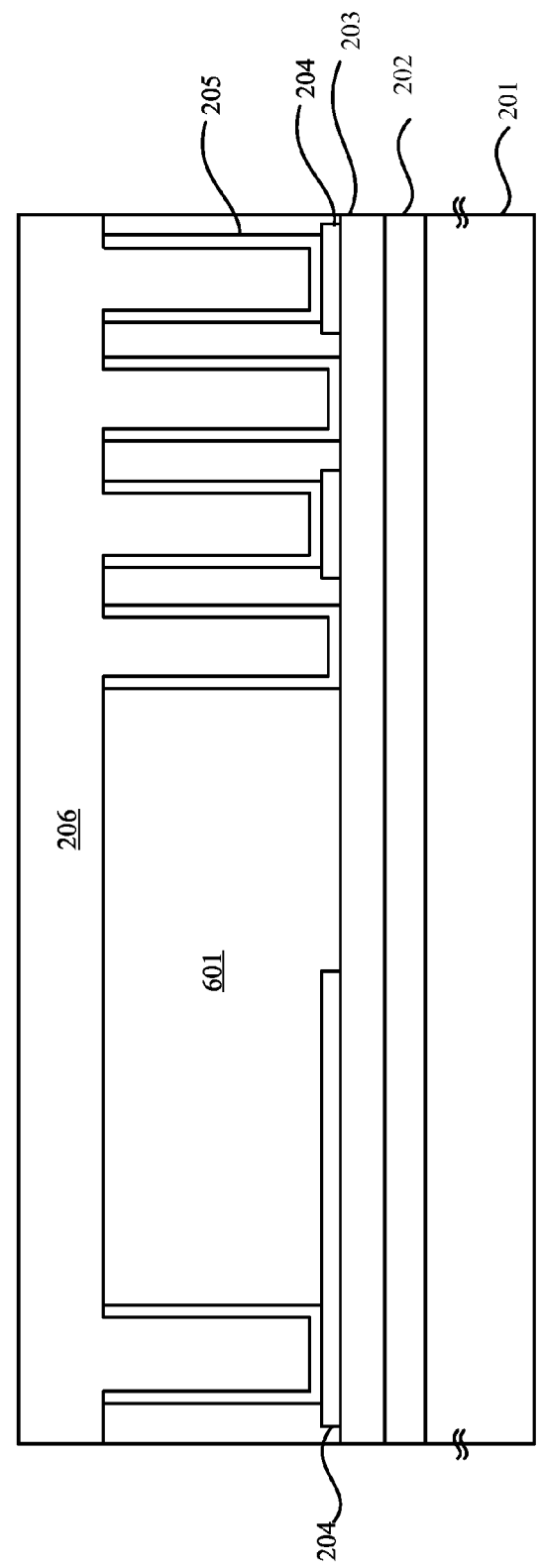
Figure 9:
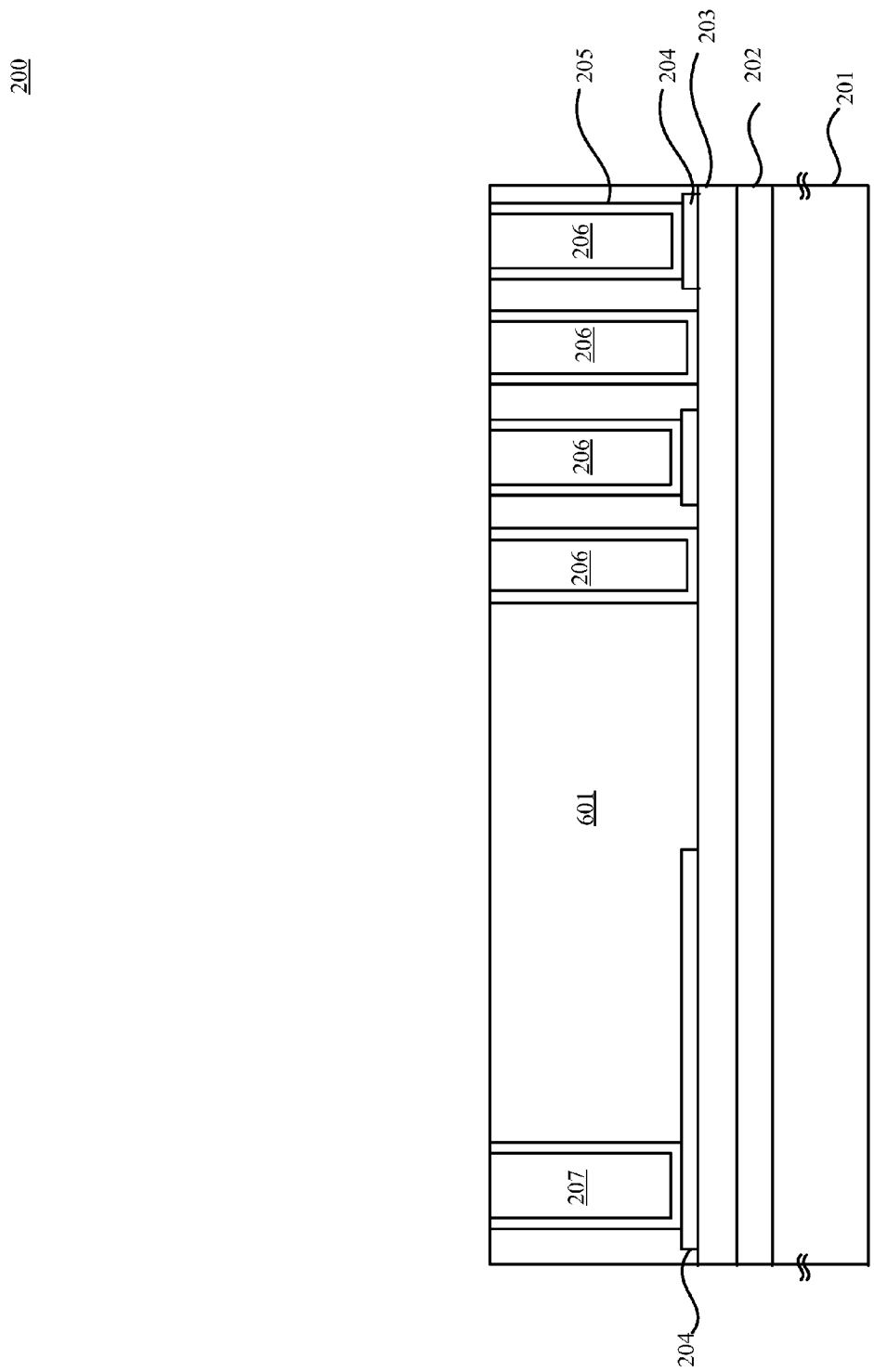

Next, in operation S350, the openings 602 are filled with the conductive material 206 including, for example, copper, titanium, nickel, tantalum, palladium, silver or gold and the like to form conductive vias, as illustrated in FIG. 8. In some embodiments, the openings 602 are plated with the conductive material 206 during a plating process, including, for example, electro-chemically plating, electroless plating, or the like. In some embodiments, the conductive material 206 overfills the openings 602, and a chemical mechanical polishing (CMP) process is performed to remove excess portions of the conductive material 206 over the photoresist 601, as illustrated in FIG. 9.

Figure 10:
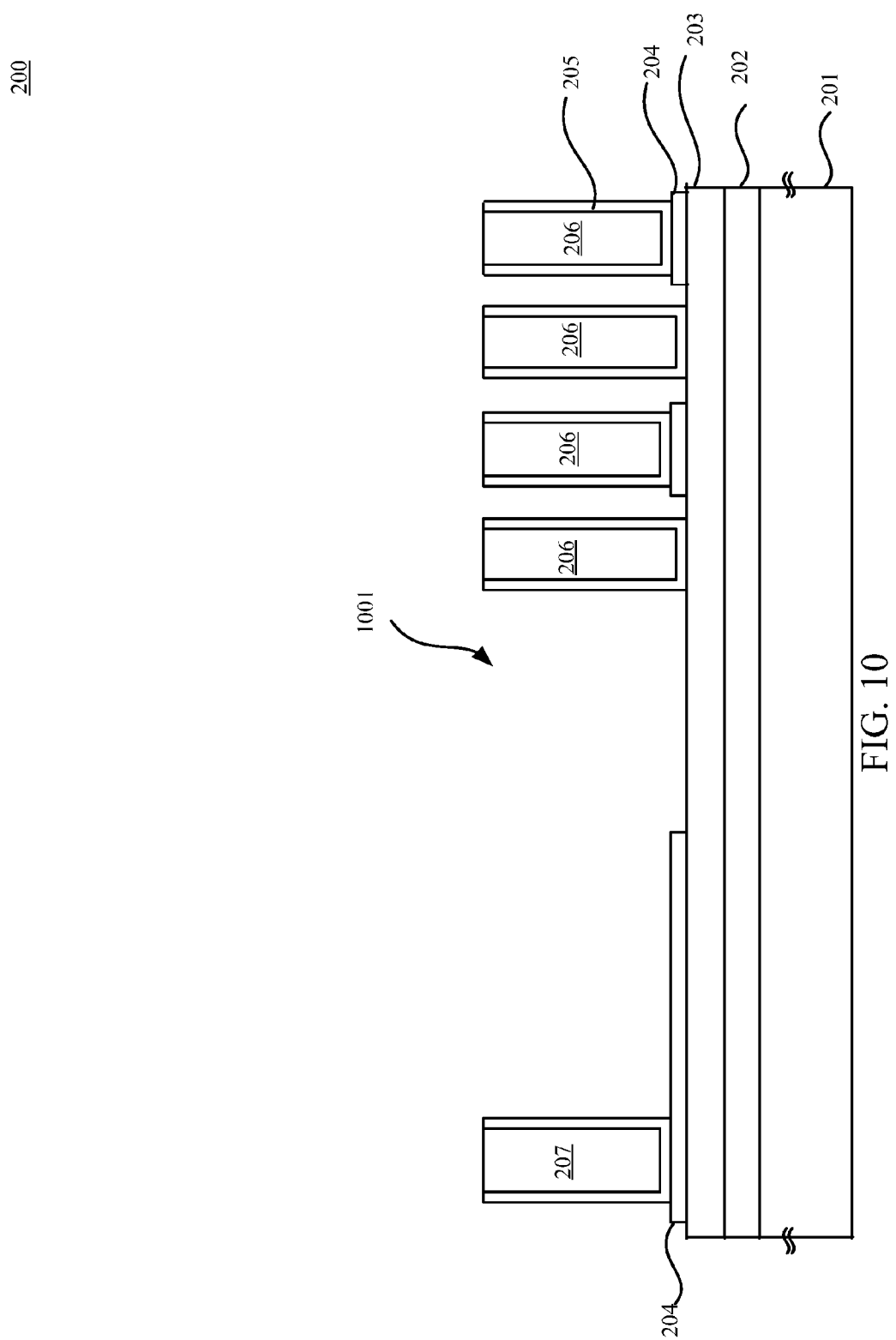

Next, in operation S360, the photoresist 601 is removed, as illustrated in FIG. 10. In some embodiments, a wet strip process is used to remove the photoresist 601. In some embodiments, the wet strip solution contains Dimethyl sulfoxide (DMSO) and Tetramethyl ammonium hydroxide (TMAH) to remove the photoresist material.

Thus, the vertical conductive structures 124, and the vertical conductive structures 144 are formed over the InFO backside RDL 204 and the polymer base layer 203 respectively. For illustration, in some embodiments, the conductive through molding vias 207 are formed over the backside RDL 204. In some embodiments, the conductive through molding vias 207 have a square shape, a rectangular shape, a circular shape, an oval shape, any other suitable shape in a cross section, or any combinations thereof. Alternatively, in some embodiments, the conductive through molding vias 207 are replaced with conductive studs or conductive wires, including, for example, copper, titanium, nickel, tantalum, palladium, silver or gold wire. In some embodiments, the conductive through molding vias 207 are spaced apart from each other and from the vertical conductive structures 124 and the vertical conductive structures 144 by the openings 1001. For illustration, at least one opening 1001 between the conductive through molding vias 207 and the semiconductor structure 100 is large enough to dispose one or more semiconductor dies therein.

Figure 11:
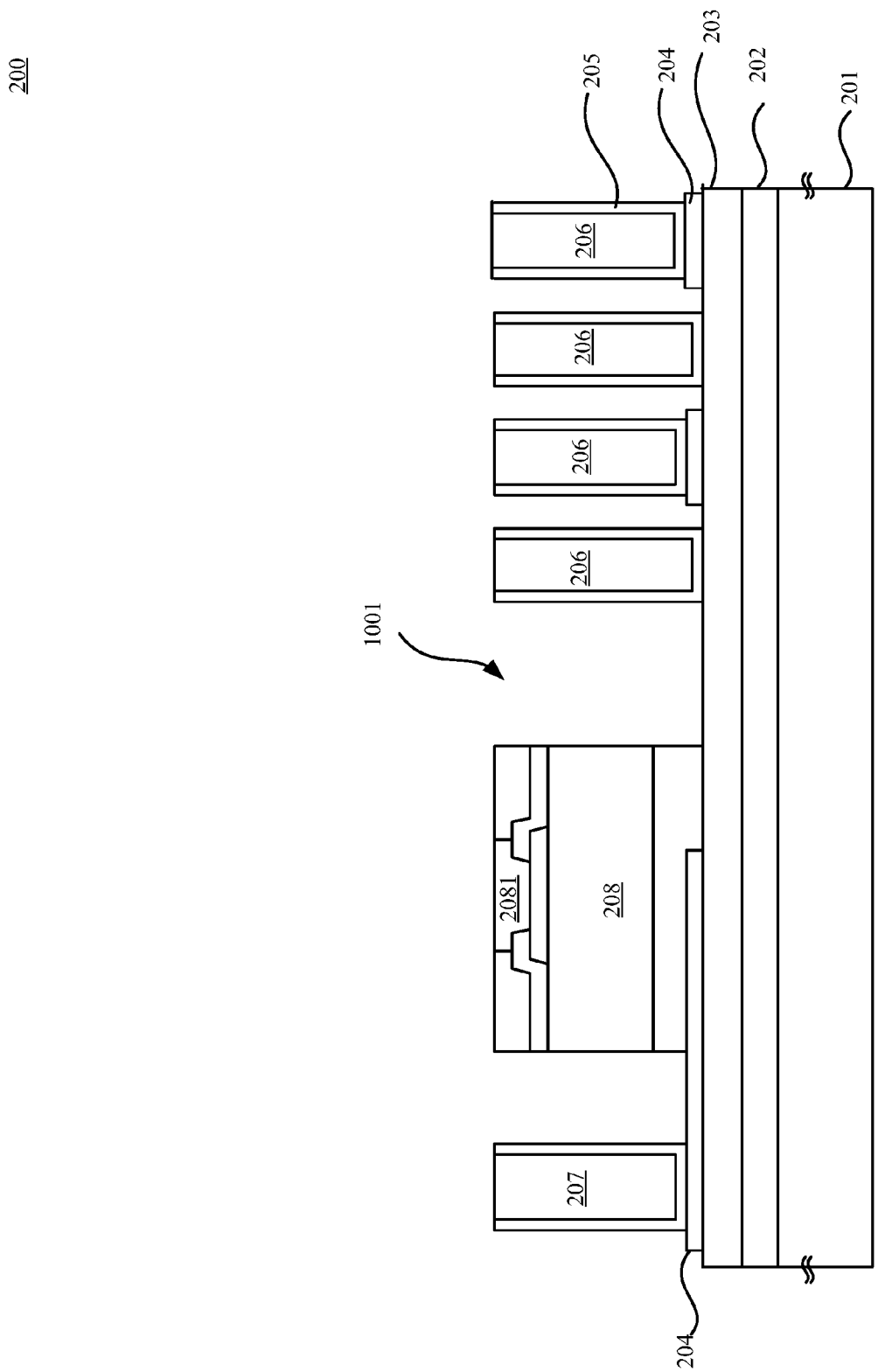

Next, in operation S370, one or more device dies 208 are mounted and attached to the package 200, as illustrated in FIG. 11. For illustration, the device package 200 includes the carrier 201, and the backside RDL 204 having conductive features as shown. In some embodiments, other interconnect structures including, for example, the conductive through molding vias 207 electrically coupled to the conductive features in the backside RDL 204 is also included. In some embodiments, an adhesive layer is used to affix the device die 208 to the backside RDL 204.

Figure 12:
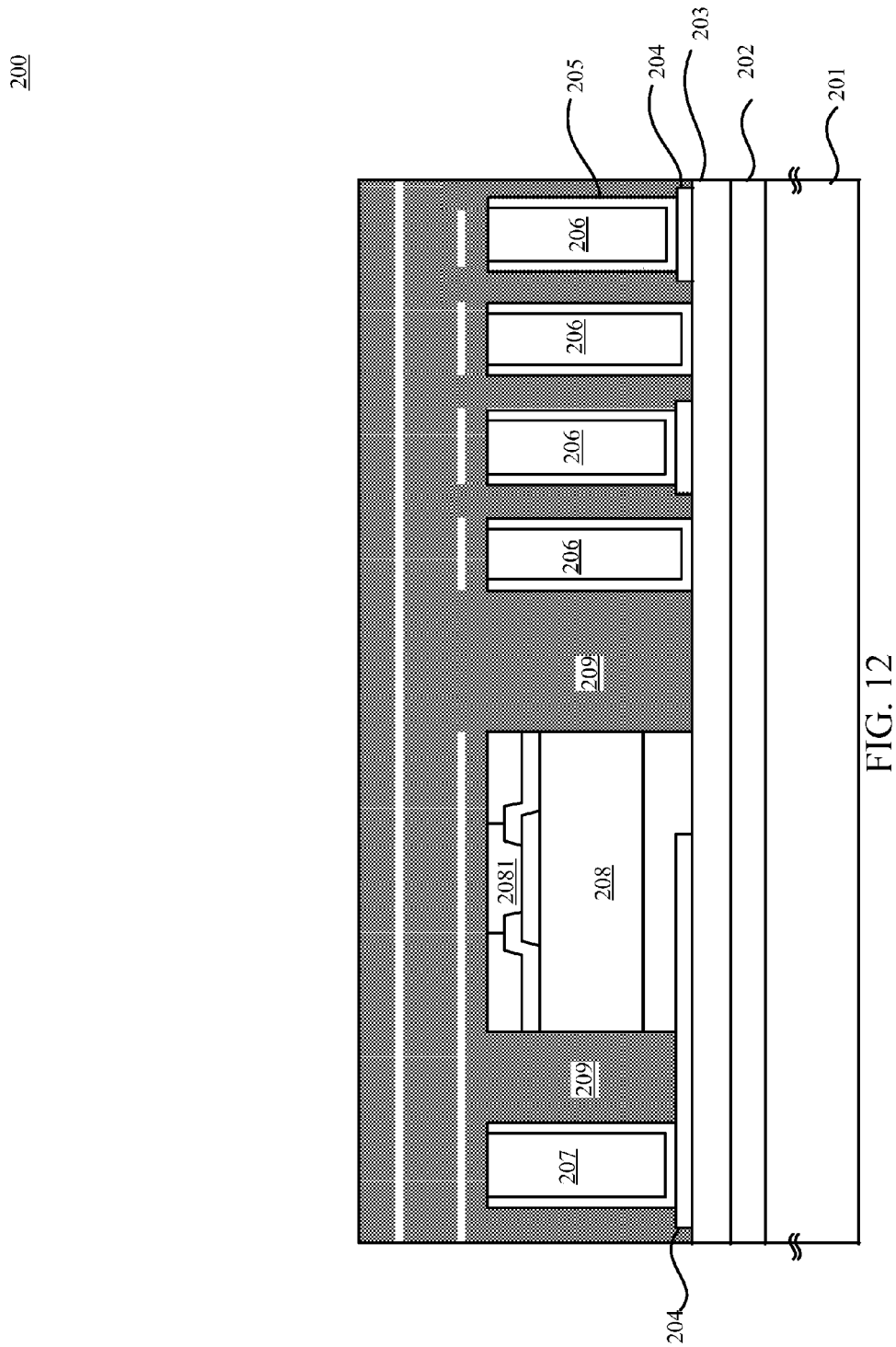

Next, in operation S380, the molding compound MC is formed within the molding layer 209 in the package 200 after the device die 208 is mounted to the backside RDL 204 in the opening 1001, as illustrated in FIG. 12. The molding compound MC is dispensed to fill gaps between the device die 208 and the conductive through molding vias 207, and gaps between the vertical conductive structures 124 and the vertical conductive structures 144. In some embodiments, the molding compound MC is filled in the gaps between the vertical conductive structures 124 and the vertical conductive structures 144 to form an insulating structure.

In some embodiments, the molding compound MC includes material with relatively high dielectric constant, including, for example, high-K polymer or silica. In some embodiments, compressive molding, transfer molding, and liquid encapsulent molding are suitable methods for forming molding compound MC, but the present disclosure is not limited thereto. For example, molding compound MC is dispensed in liquid form. Subsequently, a curing process is performed to solidify molding compound MC. In some embodiments, the filling of molding compound MC overflows the conductive through molding vias 207, the device die 208, and the vertical conductive structures 124 and 144, so that the molding compound MC covers top surfaces of the device die 208 and conductive through molding vias 207.

Figure 13:
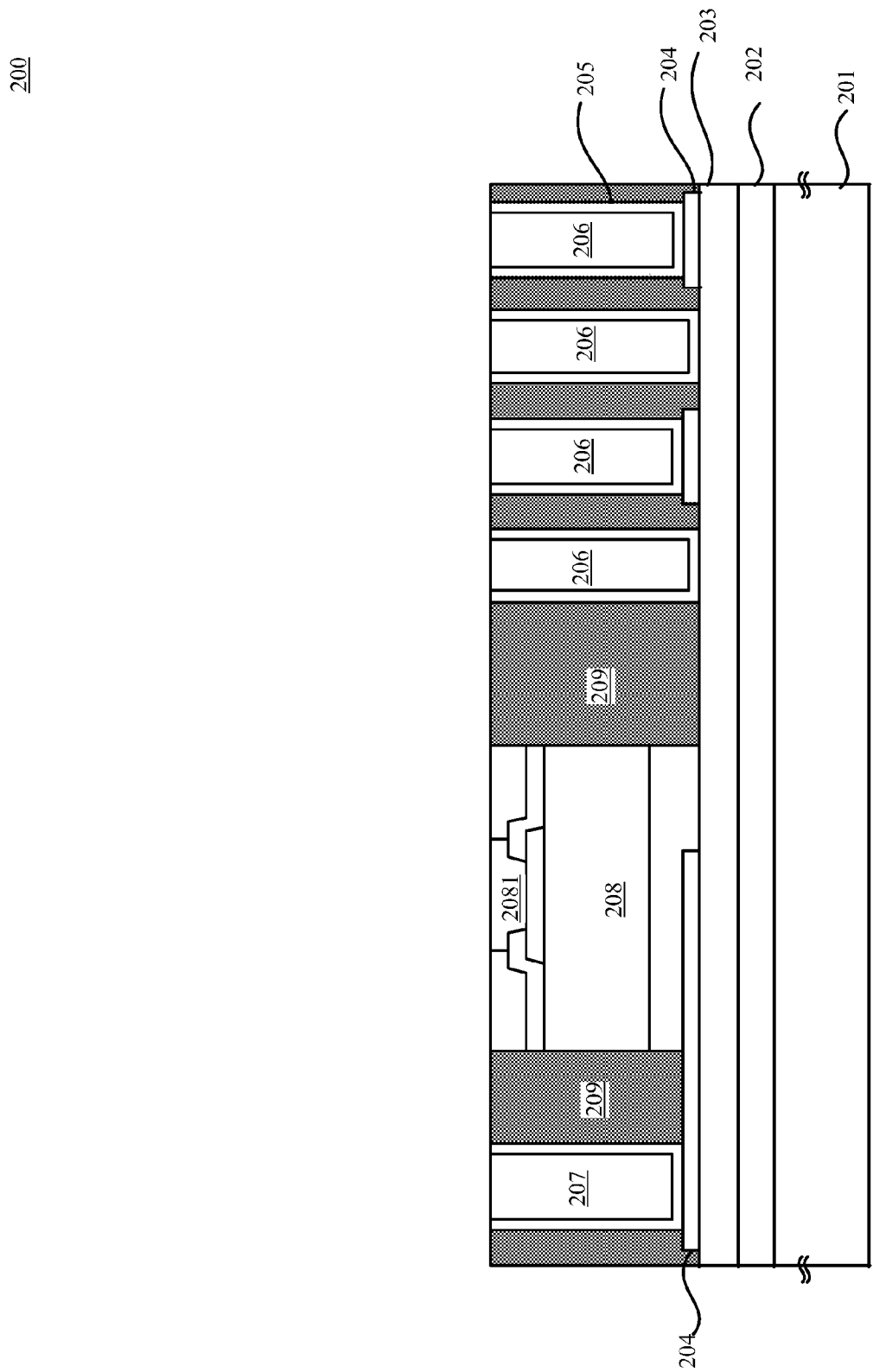

Next, in operation S390, a grinding process is performed. Next, in operation S399, a chemical mechanical polishing (CMP) process is performed. In operation S390 and S399, excess portions of the molding compound MC are removed, and the molding compound MC is ground back to reduce its overall thickness and thus expose the conductive through molding vias 207 and the vertical conductive structures 124 and 144, as illustrated in FIG. 13.

Because the resulting structure includes conductive through molding vias 207 that extend through molding compound MC, the conductive through molding vias 207 and the vertical conductive structures 124 and 144 are also referred to as through molding vias (TMVs), through inter vias (TIVs), and the like. For illustration, the conductive through molding vias 207 provide electrical connections to the backside RDL 204 in the package 200. In some embodiments, the thinning process used to expose the conductive through molding vias 207 is further used to expose conductive pillar 2081 of the device die 208.

Figure 14:
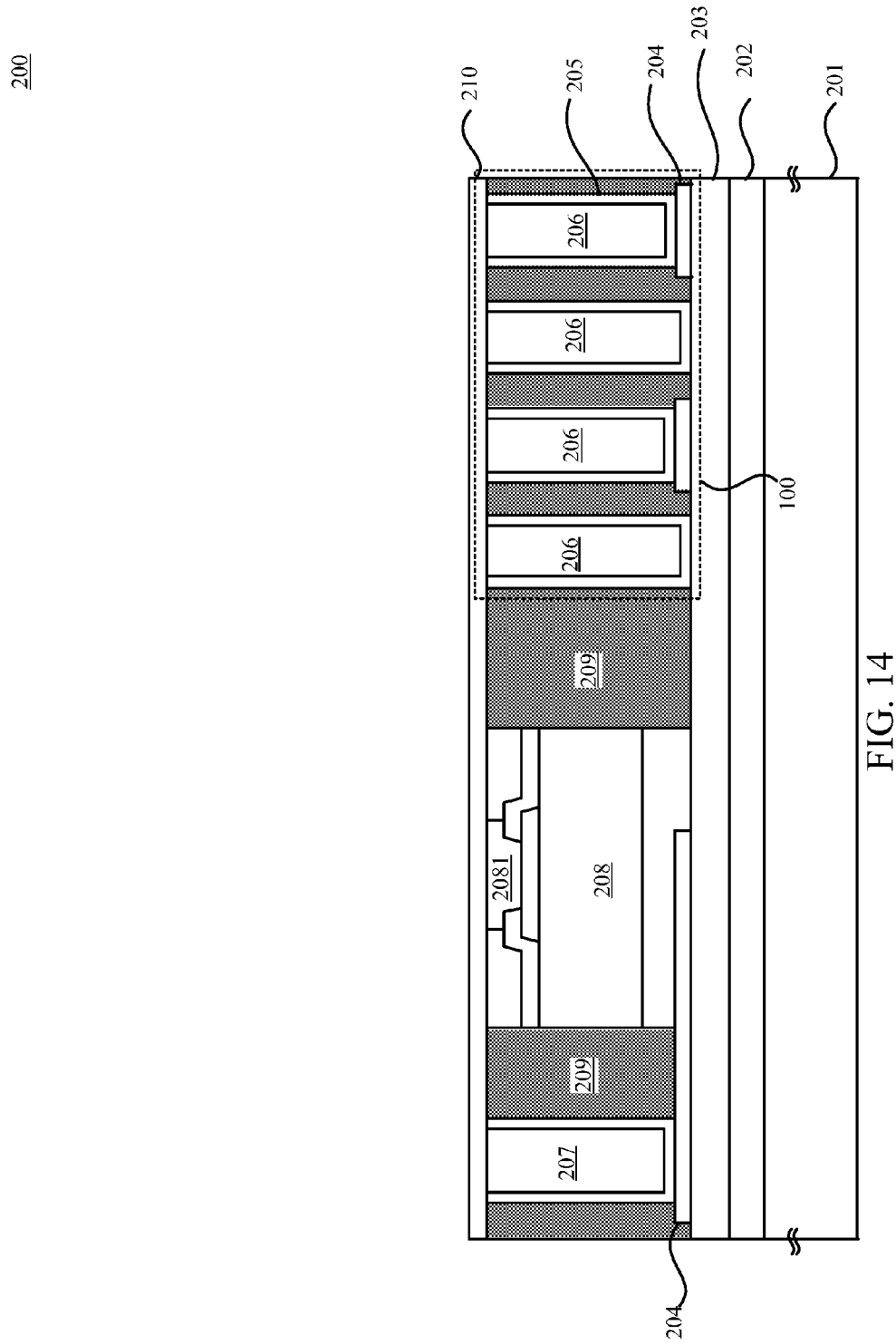

Next, in operation S400, the conductive layer 210 is formed overlying the molding layer and the molding compound MC, as illustrated in FIG. 14. For example, in some embodiments the conductive material forming the conductive layer 210 includes copper, silver, gold, or the like.

Figure 15:
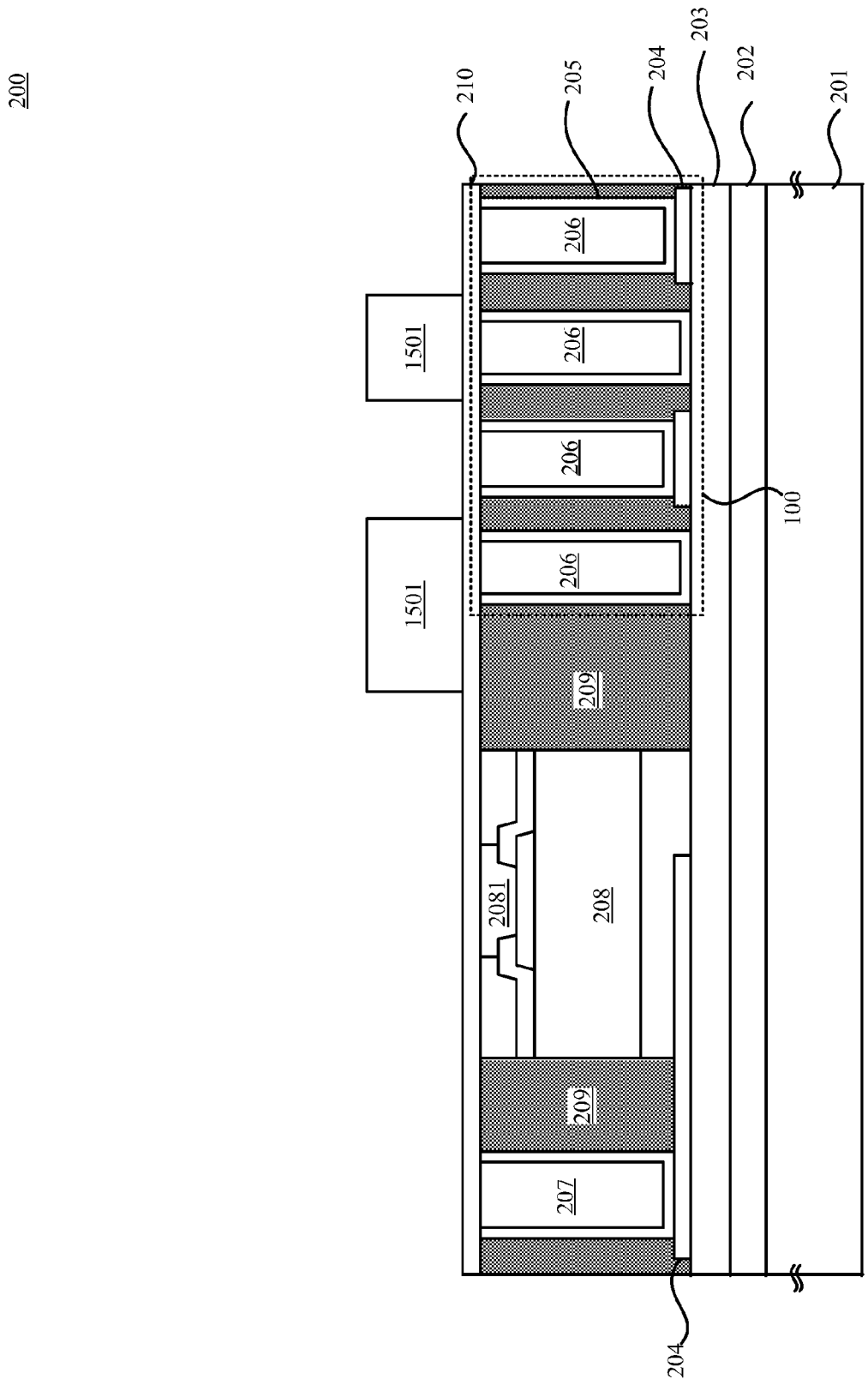

Next, in operation S410, a patterned photoresist 1501 is formed over the conductive layer 210, as illustrated in FIG. 15. Portions of photoresist 1501 are exposed using a photo mask (not shown). Exposed or unexposed portions of photoresist 1501 are then removed depending on whether a negative or positive resist is used. Portions of photoresist 1501 are removed to form openings exposed at the area of the conductive layer 210 overlying the vertical conductive structures 124, and the resulting patterned photoresist 1501 disposed at the area of the conductive layer 210 overlying the vertical conductive structures 144.

Figure 16:
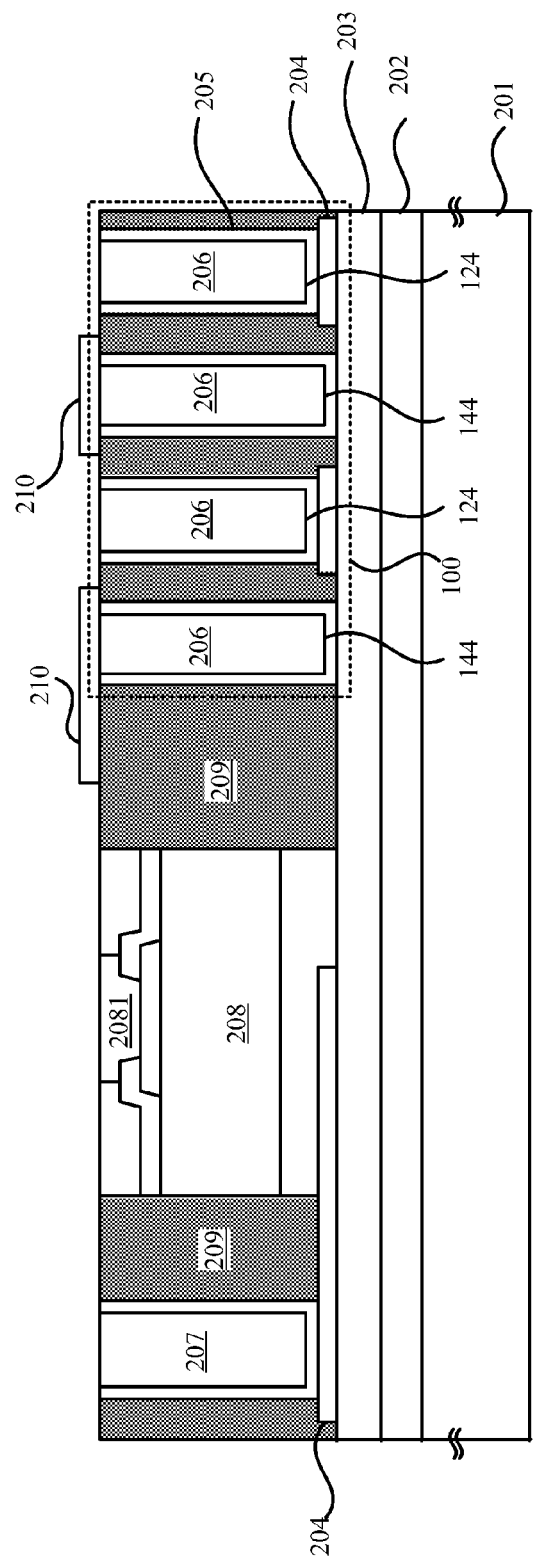

Next, in operation S420, an etching process is performed to remove the exposed portions of the conductive layer 210, as illustrated in FIG. 16. In some embodiments, the etching process includes a plasma etching, but the present disclosure is not limited thereto.

Next, in operation S430, photoresist 1501 is removed, as illustrated in FIG. 16. In some embodiments, a plasma ashing or wet strip process is used to remove photoresist 1501. In some embodiments, the plasma ashing process is followed by a wet dip in a sulfuric acid ($H_2SO_4$) solution to clean package 200 and remove remaining photoresist material.

Thus, the conductive plane 142 is formed within the conductive layer 210 and electrically coupled to the vertical conductive structures 144. When the operation S430 is completed, the semiconductor structure 100 including the electrode 120 and the electrode 140 is formed in the package 200. As illustratively shown in FIG. 16, the electrode 120 includes the conductive plane 122 and the vertical conductive structures 124, and the electrode 140 includes the conductive plane 142 and the vertical conductive structures 144. The vertical conductive structures 124 and the vertical conductive structures 144 are interlaced with each other, and the molding compound MC is filled, as the dielectric material 160, between the electrode 120 and the electrode 140.

Figure 17:
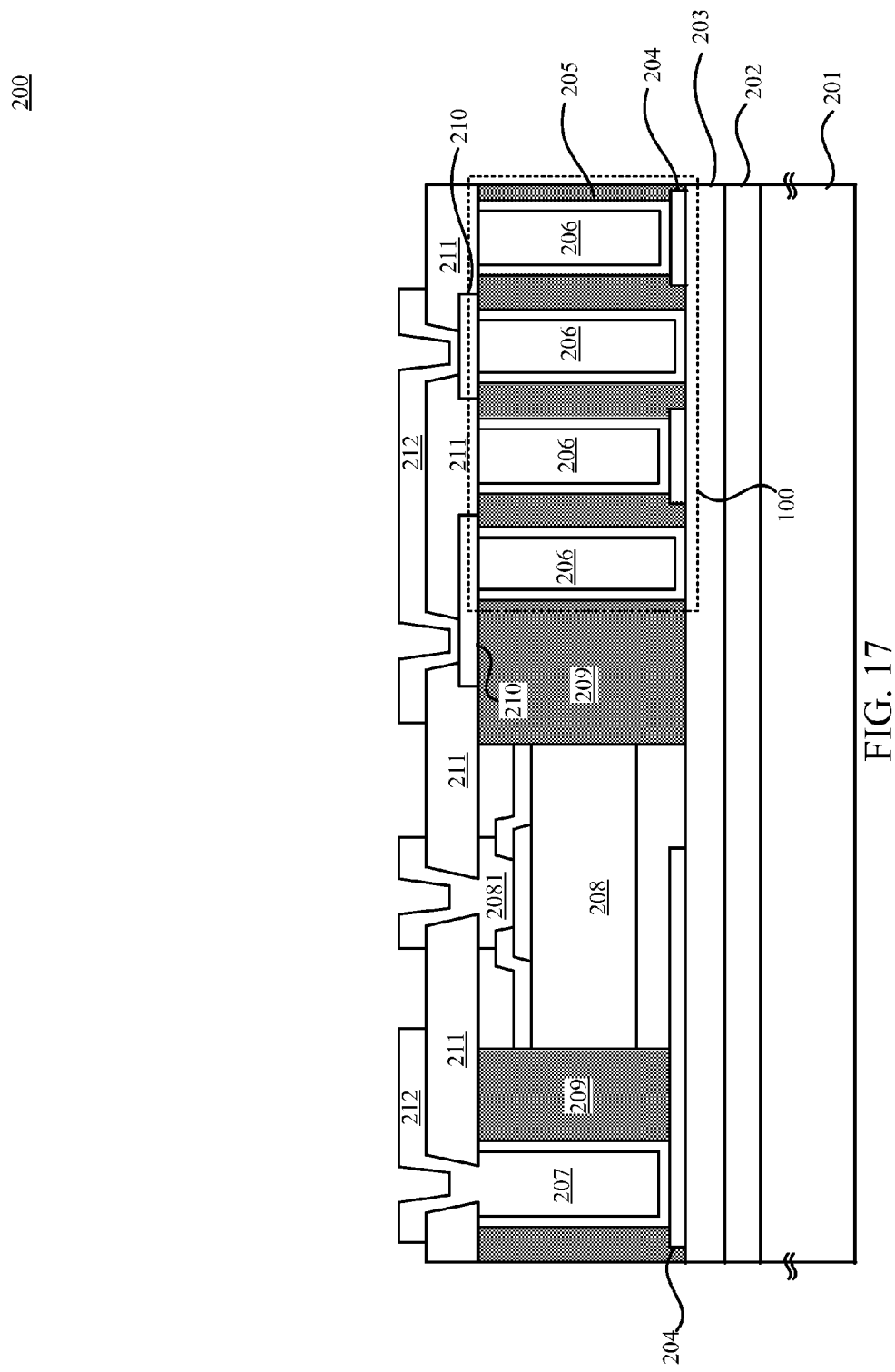

Next, in operation S440, the patterned polymer layer 211 having openings is formed overlying the molding compound MC and the conductive layer 210, as illustrated in FIG. 17. In some embodiments, the polymer layer 211 includes PI, PBO, BCB, epoxy, silicone, acrylates, nano-filled pheno resin, siloxane, a fluorinated polymer, polynorbornene, or the like. In some embodiments, the polymer layer 211 is selectively exposed to a plasma etchant, including, for example, $CF_4$, $CHF_3$, $C_4F_8$, HF, etc., configured to etch the polymer layer 211 to form the openings.

In some embodiments, the openings are filled with a conductive material. For illustration, a seed layer (not shown) is formed in the openings and the conductive material is plated in the openings using, for example, an electrochemical plating process, electroless plating process, or the like. The resulting via holes in the polymer layer 211 are electrically coupled to the conductive pillar 2081, the conductive layer 210, or the conductive through molding vias 207, as illustratively shown.

In some embodiments, one or more additional polymer layers having conductive features are formed over the polymer layer 211. In operation S450, the RDL 212 having conductive features is formed, as illustrated in FIG. 17. As illustratively shown, in some embodiments, the conductive features are electrically coupled to the conductive layer 210 through the via holes in the polymer layer 211.

Figure 18:
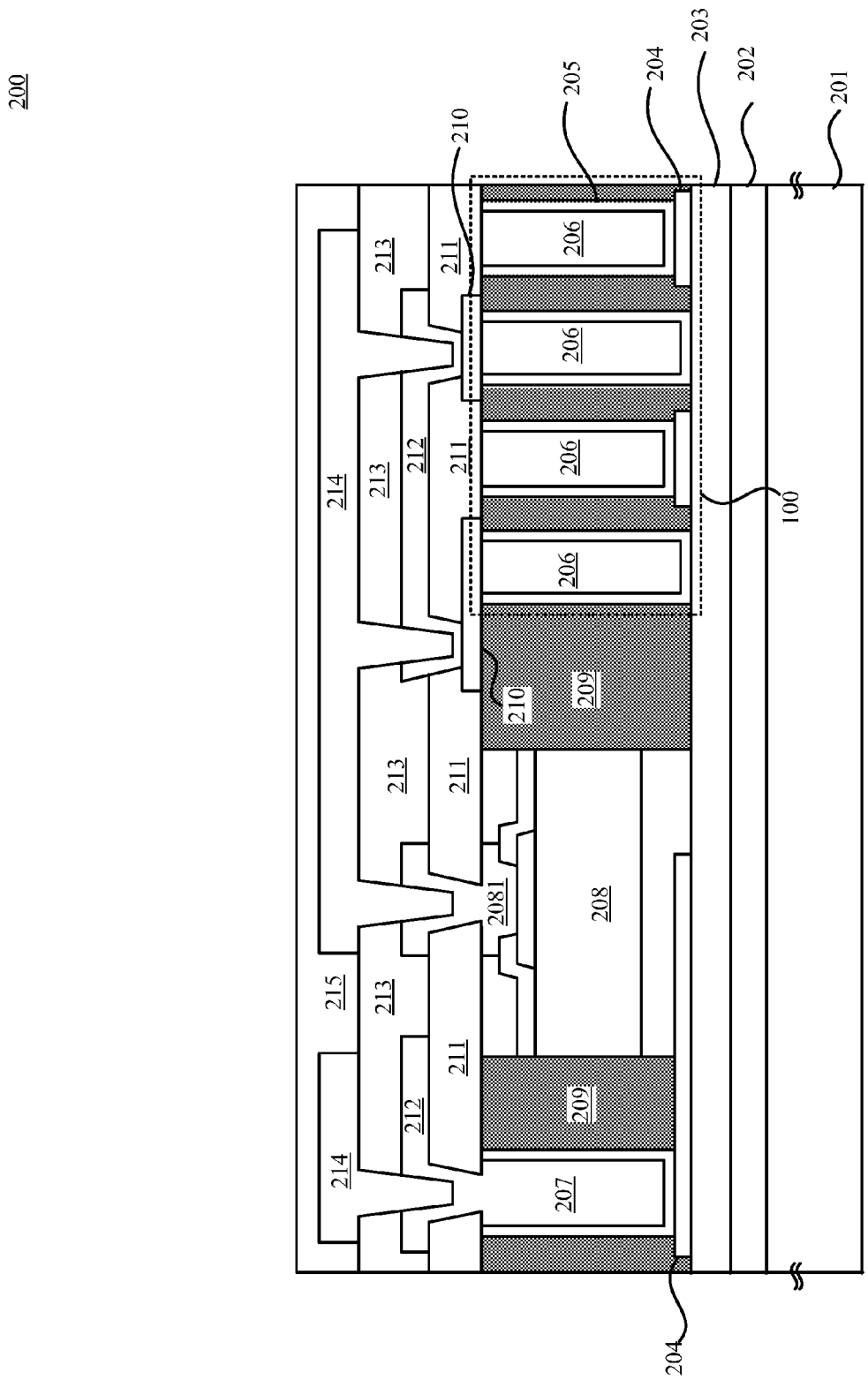

Next, in operation S460, the patterned polymer layer 213 having openings is formed overlying the patterned polymer layer 211 and the RDL 212, as illustrated in FIG. 18. In some embodiments, the polymer layer 213 includes PI, PBO, BCB, epoxy, silicone, acrylates, nano-filled pheno resin, siloxane, a fluorinated polymer, polynorbornene, or the like. In some embodiments, the polymer layer 213 is selectively exposed to a plasma etchant, including, for example, $CF_4$, $CHF_3$, $C_4F_8$, HF, etc., configured to etch the polymer layer 213 to form the openings.

Next, in operation S470, the RDL 214 having at least one conductive feature is formed, as illustrated in FIG. 18. As illustratively shown, in some embodiments, the conductive features are electrically coupled to the conductive features in the RDL 212 through the via holes in the polymer layer 213. The conductive feature is electrically coupled to the device die 208 through the conductive vias and the conductive pillar 2081, and electrically coupled to the electrode 140 through the conductive vias and the conductive layer 210. In some embodiments, the RDLs 212 and 214 are substantially similar to the backside RDL 204 both in composition and formation process, and thus detailed description is omitted for brevity. In some embodiments, the patterned polymer layer 215 is formed overlying the patterned polymer layer 213 and the RDL 214, as illustrated in FIG. 18.

Figure 19:
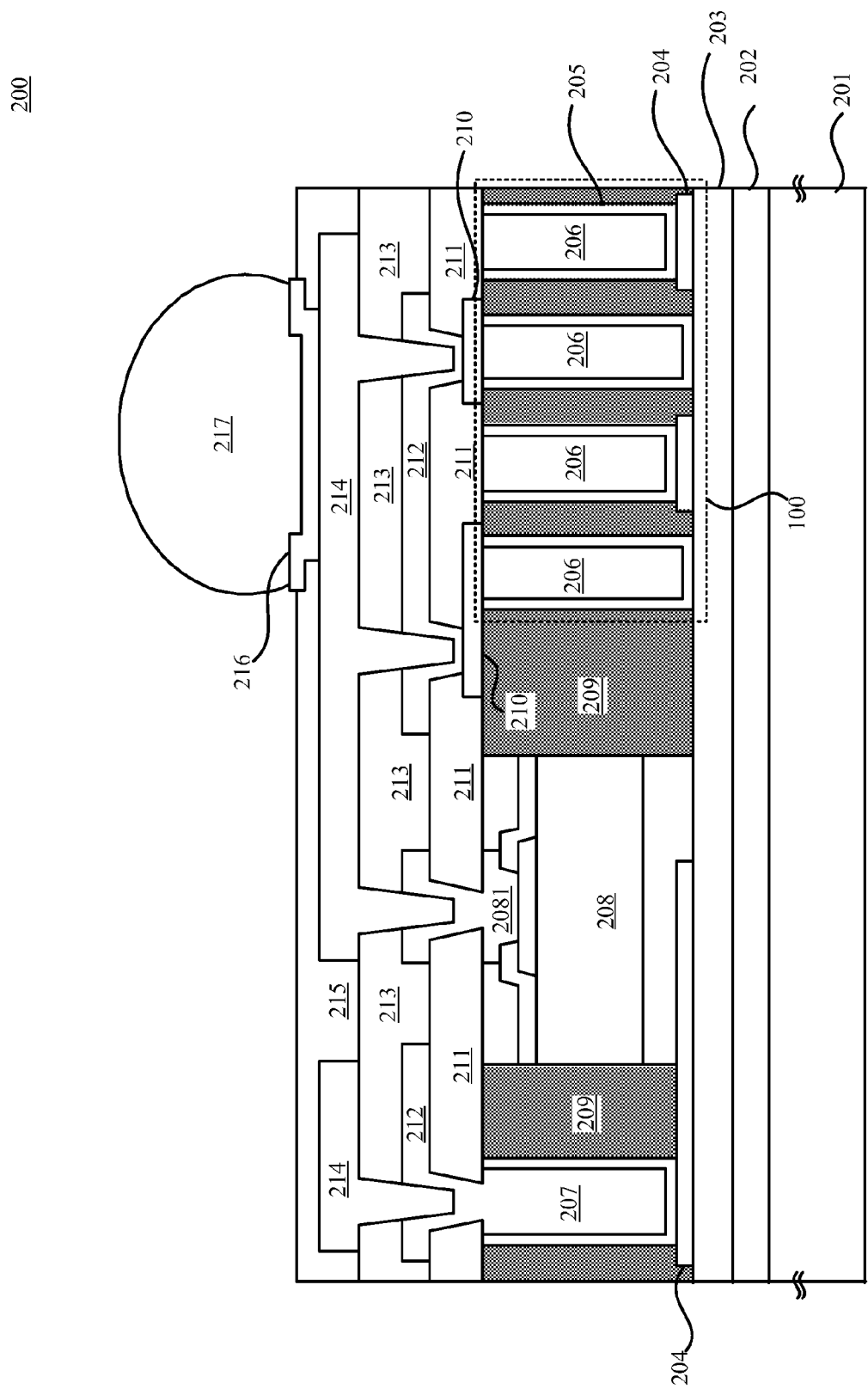

Next, in operation S480, external connectors 217, which are configured to be the input/output (I/O) pads, including, for example, solder balls on Under Bump Metallurgies (UBMs) 216 are then formed to electrically connect to the device die 208 through the RDL 214, as illustrated in FIG. 19. In some embodiments, the connectors 217 are ball grid array (BGA) balls, controlled collapse chip connector (C4) bumps, and the like disposed upon UBMs 216, which are formed over the RDL 214. In some embodiments, the connectors 217 are used to electrically connect the InFO package 200 to other package components including, for example, another device die, interposers, package substrates, printed circuit boards, a mother board, and the like.

Next, the carrier 201 and adhesive layer 202 are removed from the InFO package. The resulting structure is shown in FIG. 2. In some embodiments, the polymer base layer 203 is also removed from the InFO package. In some alternative embodiments, the polymer base layer 203 is not removed, and is left in the resulting package as a bottom protective layer.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 20:
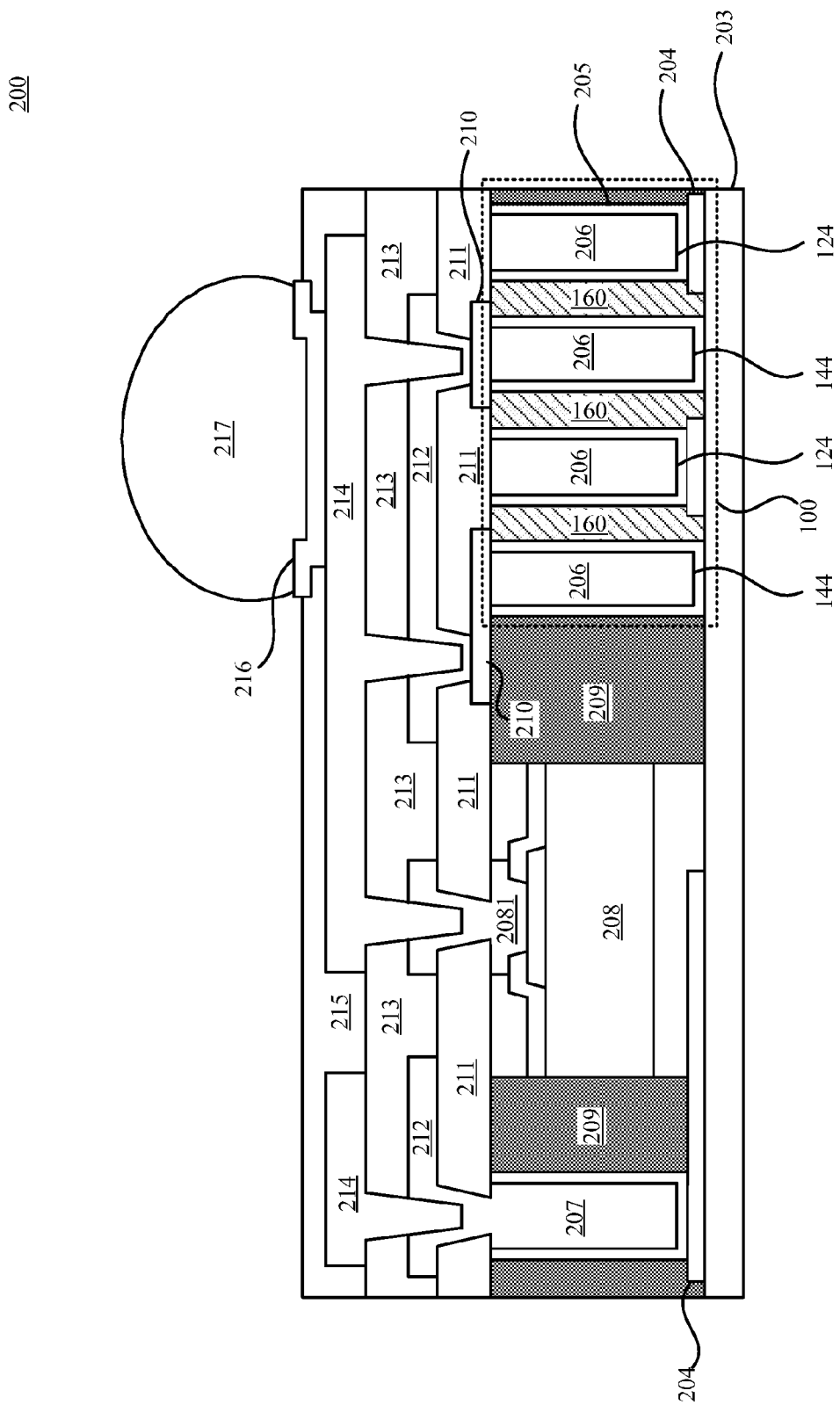
FIG. 20 is a schematic diagram illustrating an integrated Fan-Out (InFO) package including the semiconductor structure in FIG. 1 in accordance with some embodiments of the present disclosure.

Reference is made to FIG. 20. FIG. 20 is a schematic diagram illustrating another integrated Fan-Out (InFO) package 200 including the semiconductor structure 100 in FIG. 1 in accordance with some other embodiments of the present disclosure. With respect to the embodiments of FIG. 2, like elements in FIG. 20 are designated with the same reference numbers for ease of understanding.

Compared with the embodiments shown in FIG. 2, in the embodiments illustratively shown in FIG. 20, the dielectric material 160 and the molding compound MC are different materials. The dielectric material 160 is filled between the vertical conductive structures 124 and the vertical conductive structures 144 in the semiconductor structure 100 to form an insulating structure. For example, in some embodiments, the dielectric constant (or permittivity) value of the dielectric material 160 is greater than that of the molding compound MC. In some embodiments, the molding compound MC is applied in the molding layer outside the semiconductor structure 100 to surround the device die 208, and the molding compound MC has a low-k value, e.g., less than about 3.9, and even less than about 2.5 in other embodiments. In some embodiments, the molding compound MC includes any suitable material including, for example, an epoxy resin, a molding underfill, or the like.

In some embodiments, the dielectric material 160 includes room-temperature (e.g., 25° C.) liquid-phase high-K polymer, including, for example, polyimide (PI), polybenzoxazole (PBO), etc. In some other embodiments, the dielectric material 160 includes room-temperature or low-temperature (e.g., below 250° C.) liquid-phase $SiO_2$ or Spin on Glass (SOG), of which the dielectric constant is greater than or equal to approximately 4. In some other embodiments, the dielectric material 160 includes liquid phase SiNx or other high-K dielectric. In some other embodiments, the dielectric material 160 includes low-temperature (e.g., 180° C.) chemical vapor deposited $SiO_2$ (CVD-$SiO_2$), SiNx or SiOxNy deposition, including, for example, atmospheric pressure CVD (APCVD), sub-atmospheric CVD (SACVD), plasma enhanced CVD (PECVD), metal organic CVD (MOCVD), etc. In some other embodiments, the dielectric material 160 includes low-temperature (e.g., 210° C.) high-K dielectric deposition including, for example, $ZrO_2$-$Al_2O_3$-$ZrO_2$ (ZAZ) or other High-K dielectric deposition including, for example, $ZrO_2$, $Al_2O_3$, HfOx, HfSiOx, ZrTiOx, $TiO_2$, TaOx, etc. In some other embodiments, the dielectric material 160 includes hybrid atomic layer deposited SrO (ALD-SrO) electrode and chemical vapor deposited $RuO_2$ (CVD-$RuO_2$) dielectric layer. For example, in some other embodiments, the dielectric material 160 includes a $SrRuO_3$-$SrTiO_3$-$SrRuO_3$ (SRO-STO-SRO) structure.

Figure 21:
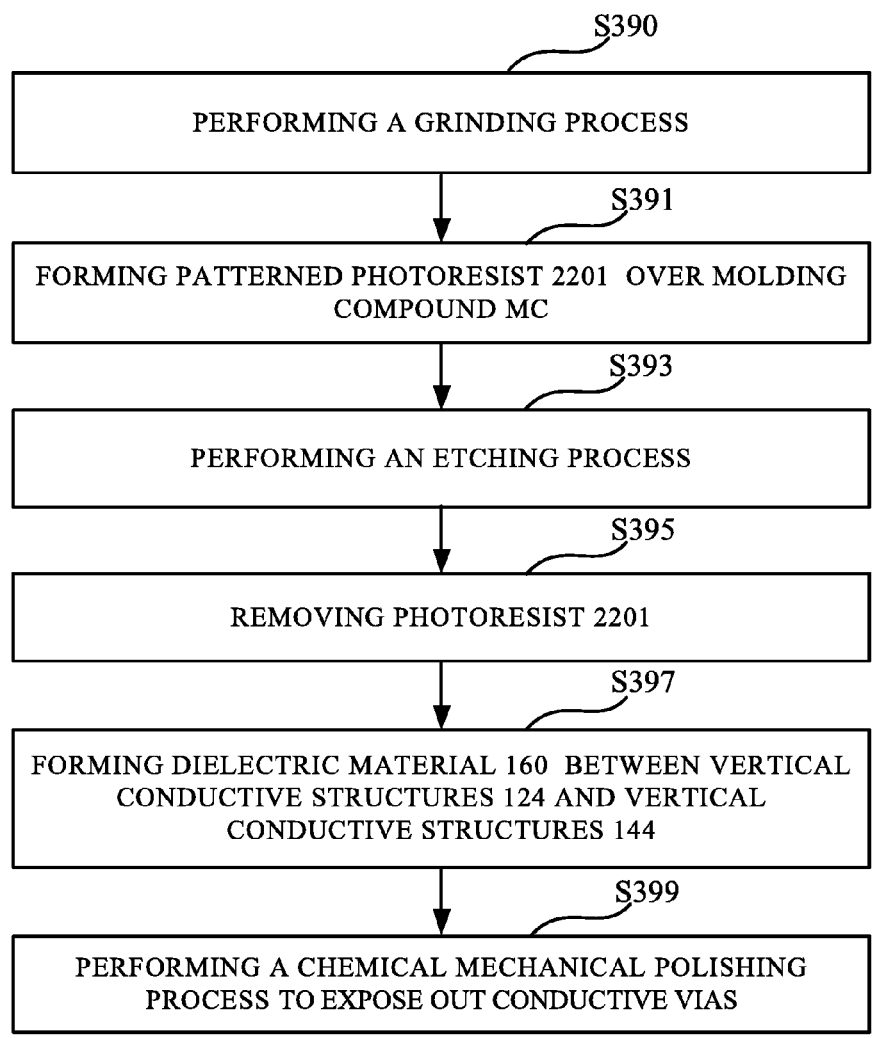
FIG. 21 is a flow chart illustrating a method for fabricating the semiconductor structure in FIG. 20 in accordance with some embodiments of the present disclosure.

FIG. 21 is a flowchart illustrating a method 2100 of forming the Integrated Fan-Out (InFO) package 200 as illustrated in FIG. 20, in accordance with some embodiments of the present disclosure. For better understanding of the present disclosure, the method 2100 is discussed in relation to the semiconductor structure 100 shown in FIG. 1 and FIG. 20, but is not limited thereto.

For illustration, the manufacturing process of the Integrated Fan-Out (InFO) package 200 illustrated in FIG. 20 is described by the method 2100 with FIGS. 22-26. FIGS. 22-26 are cross sectional views of the Integrated Fan-Out (InFO) package 200 at different stages of the manufacturing process, in accordance with some embodiments of the present disclosure. After the different stages in FIGS. 4-19 and FIGS. 22-26, the package 200 has the cross sectional view in FIG. 20. Although FIGS. 22-26 are described together with the method 2100, it will be appreciated that the structures disclosed in FIGS. 22-26 are not limited to the method 2100. With respect to the embodiments of FIGS. 4-19, Like elements in FIGS. 22-26 are designated with the same reference numbers for ease of understanding.

Compared to the method 300 illustrated in the FIG. 3, in the method 2100 illustrated in FIG. 21, the molding compound MC includes material with relatively low dielectric constant, including, for example, an epoxy resin, a molding underfill, or the like.

Figure 22:
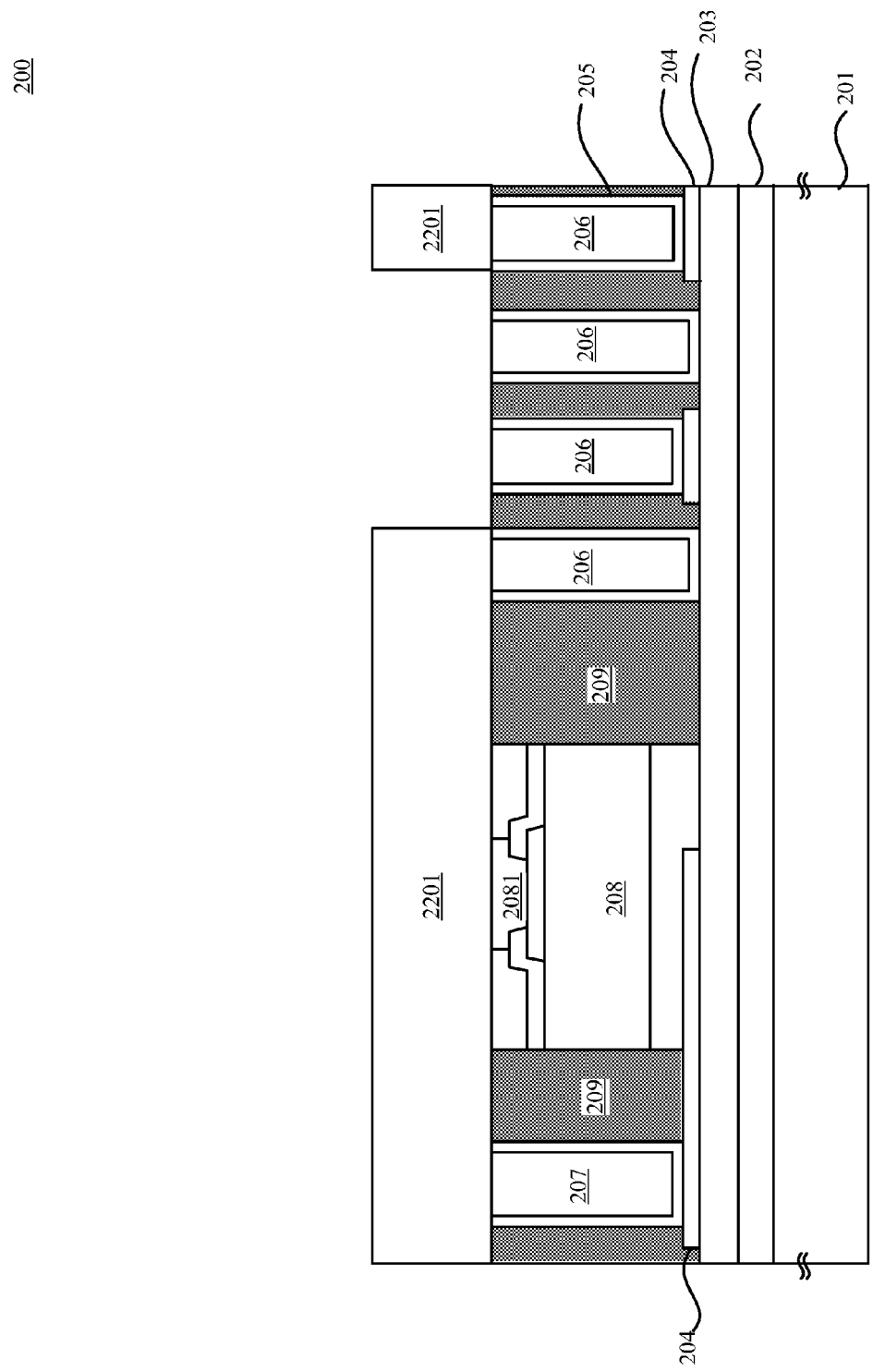
FIGS. 22-26 are cross sectional views of the package in FIG. 20 at different stages of a manufacturing process, in accordance with some embodiments of the present disclosure.

After the grinding process in operation S390 is performed, as illustrated in FIG. 22, operation S391 is performed. In operation S391, a patterned photoresist 2201 is formed over the molding compound MC, as illustrated in FIG. 22. Portions of photoresist 2201 are exposed using a photo mask (not shown). Exposed or unexposed portions of photoresist 2201 are then removed depending on whether a negative or positive resist is used. Portions of photoresist 2201 are removed to form openings exposed at the area of the molding compound MC between the vertical conductive structures 124 and the vertical conductive structures 144, and the resulting patterned photoresist 2201 disposed at the area of the molding compound MC surrounding the device die 208.

Figure 23:
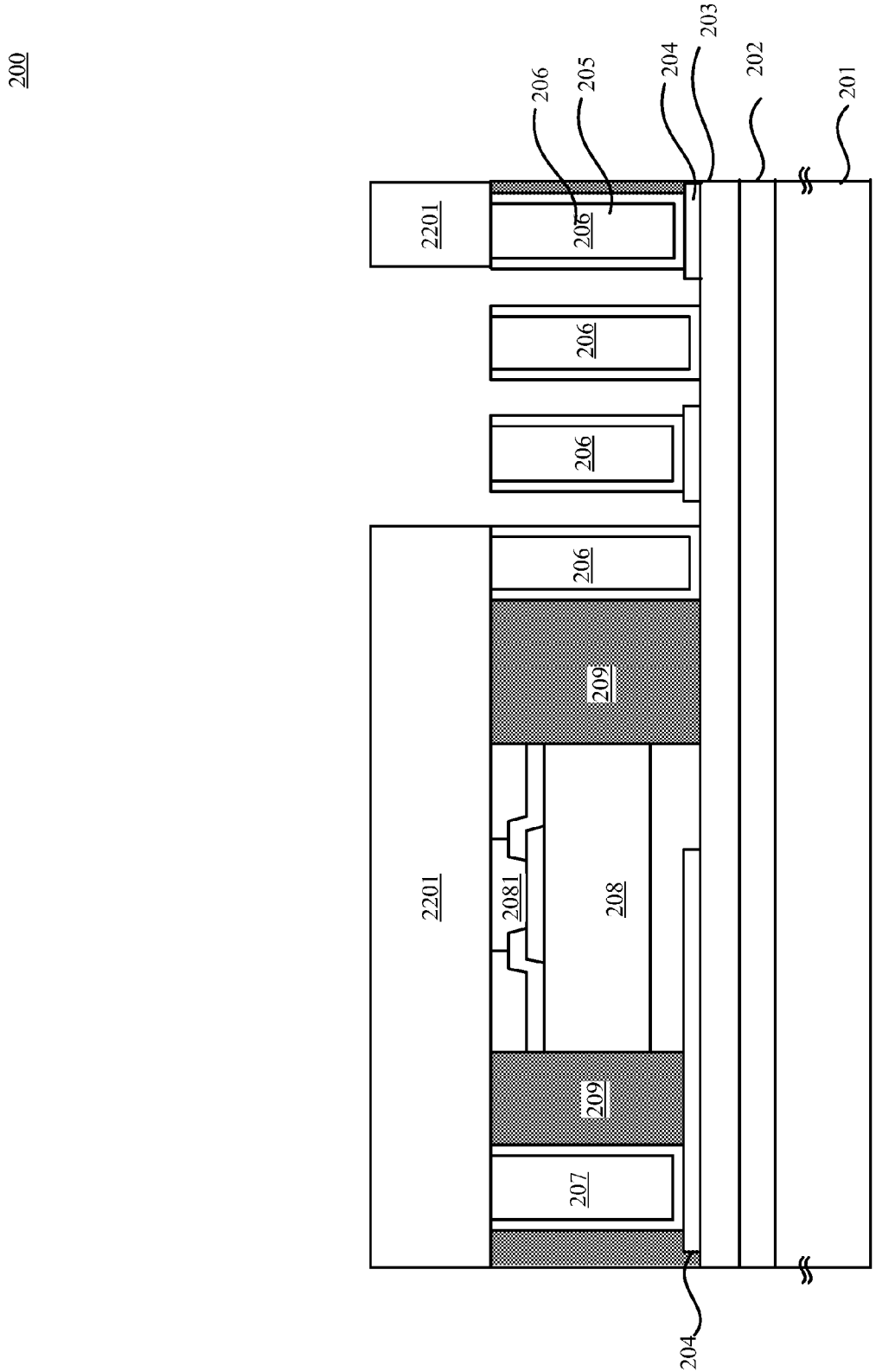

Next, in operation S393, an etching process is performed to remove the exposed portions of the molding compound MC between the vertical conductive structures 124 and the vertical conductive structures 144, as illustrated in FIG. 23. In some embodiments, a wet etching using HF and AMAR (Cu+$NH_3$ compound) is applied. In some other embodiments, a wet etching using HF and LDPP, which contains TMAH, is applied.

Figure 24:
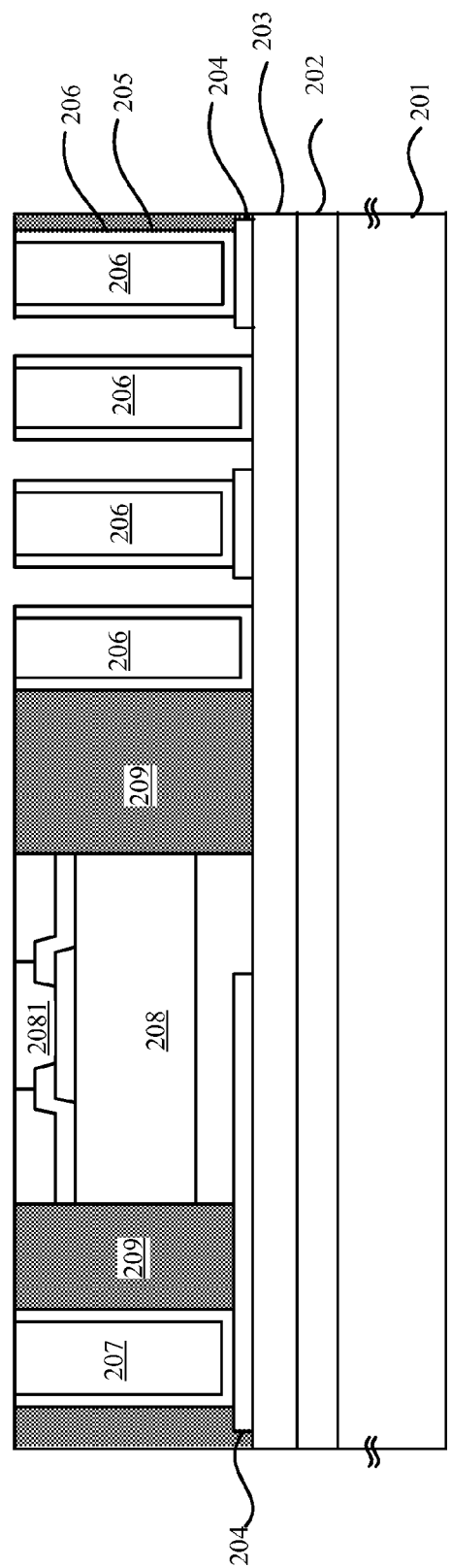

Next, in operation S395, the photoresist 2201 is removed, as illustrated in FIG. 24. In some embodiments, a wet strip process is used to remove the photoresist 2201. In some embodiments, during the wet strip process, Dimethylsufoxide (DMSO) and Tetramethyl ammonium hydroxide (TMAH) are used to remove the photoresist material. For example, the photoresist 2201 is removed using Dimethylsufoxide (DMSO) to dissolve photoresist 2201 and make photoresist 2201 swollen, and Tetramethyl ammonium hydroxide (TMAH) is used to cut the polymer cross-linkage.

Figure 25:
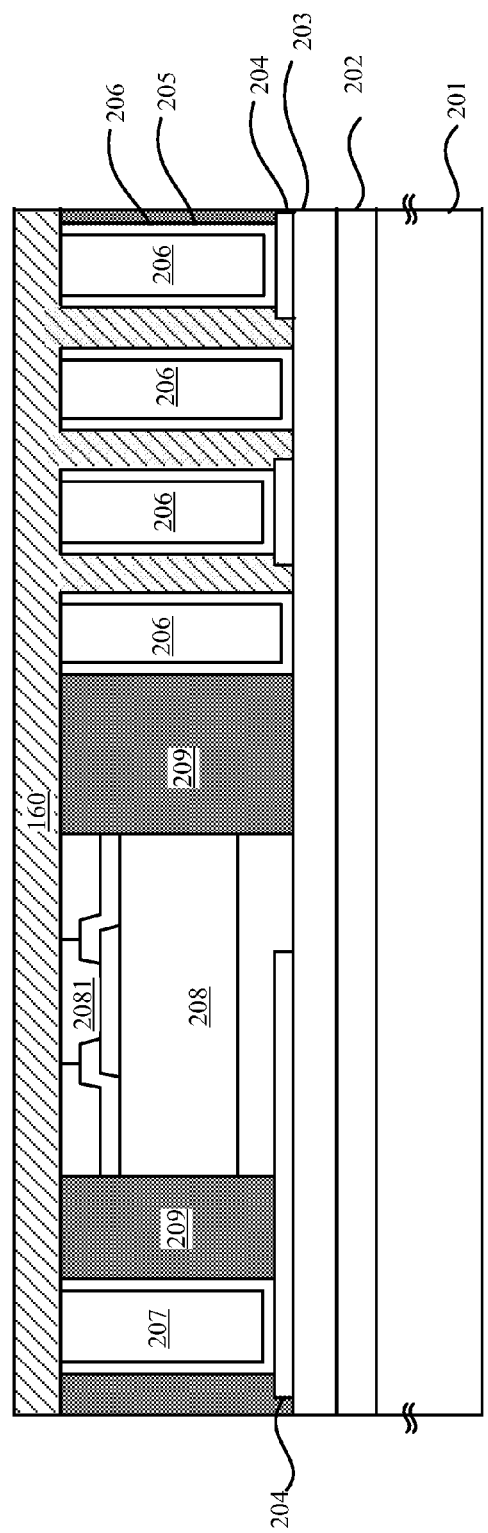

Next, in operation S397, the dielectric material 160 is formed between the vertical conductive structures 124 and the vertical conductive structures 144 and overlying the molding layer 209, as illustrated in FIG. 25. In some embodiments, the dielectric constant of the dielectric material 160 is higher than which of the molding compound MC.

Figure 26:
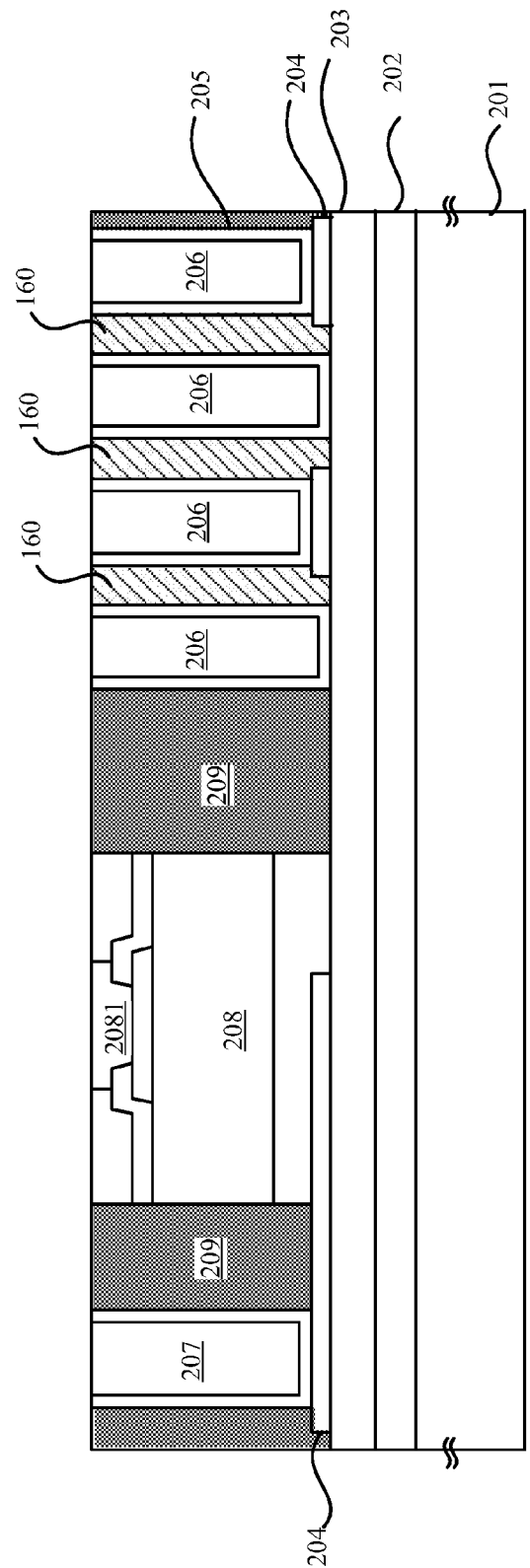

Next, the chemical mechanical polishing (CMP) process in operation S399 is performed to remove excess portions of the dielectric material 160 and to expose out conductive features such as conductive material 206, conductive vias 207, and the conductive pillar 2081, as illustrated in FIG. 26. Thus, the dielectric material 160 different from the molding compound MC is filled between the vertical conductive structures 124 and the vertical conductive structures 144.

In some embodiments, the method 2100 includes operations S310-S390 performed before operation S391, and operations S400-S480 performed after operation S399. Operations S310-S390 and S400-S480 in the method 2100 are similar to of which in the method 300, and are fully described in the aforementioned paragraphs and FIGS. 4-19. Thus, detailed description is omitted for brevity.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 27:
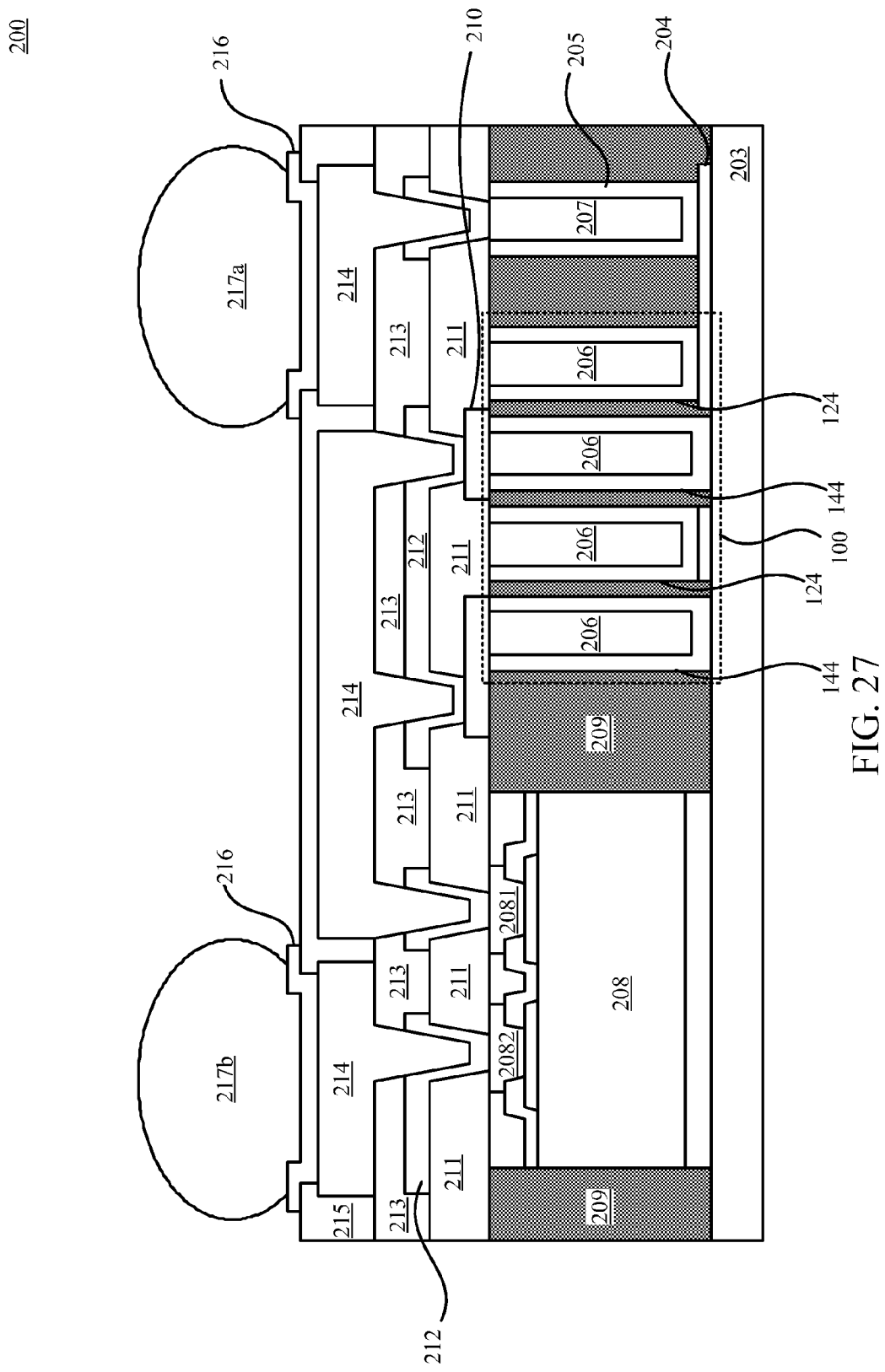
FIG. 27 is a schematic diagram illustrating an Integrated Fan-Out (InFO) package including the semiconductor structure in FIG. 1 in accordance with some embodiments of the present disclosure.

Reference is made to FIG. 27. FIG. 27 is a schematic diagram illustrating another Integrated Fan-Out (InFO) package 200 including the semiconductor structure 100 in FIG. 1 in accordance with various embodiments of the present disclosure. With respect to the embodiments of FIG. 2, like elements in FIG. 27 are designated with the same reference numbers for ease of understanding.

Compared with the embodiments shown in FIG. 2, in the embodiments illustratively shown in FIG. 27, the device die 208 includes two conductive pillars 2081 and 2082, and the conductive through molding via 207 is arranged at another side of the device die 208. For illustration, in some embodiments, the conductive through molding via 207 is electrically coupled to the external connector 217a, through the RDLs 212 and 214, to connect to the ground, and electrically coupled to the vertical conductive structures 124 via the backside redistribution layer 204. Thus, the bottom electrode of the MIM structure is coupled to the ground. The conductive pillar 2081 is electrically coupled through RDLs 212 and 214 into the positive voltage side of the Finger MIM. In addition, the vertical conductive structures 144 are electrically coupled to each other via the RDL 212. Thus, the upper electrode of the MIM structure is coupled to the device die 208 via the RDL 214 and the conductive pillar 2081. The conductive pillar 2082 is electrically coupled to the external connector 217b, through the RDLs 212 and 214, to receive the input signal for the device die 208 via the external connector 217b. Similar to the embodiment shown in FIG. 2, the high-k molding compound MC is filled in the molding layer 209 and filled between the vertical conductive structures 124 and the vertical conductive structures 144 in the semiconductor structure 100 to form a finger-typed MIM capacitor structure for suppressing the signal noise sent from the die 208 through conductive pillar 2081 and RDLs 214, 212 and 210. In some embodiments, the vertical conductive structures 124 and 144 have a square shape, a rectangular shape, any other suitable shape in a cross section, or any combinations thereof.

The manufacturing process of the Integrated Fan-Out (InFO) package 200 illustrated in FIG. 27 is similar to the manufacturing process of the Integrated Fan-Out (InFO) package 200 illustrated in FIG. 2, which is fully described in the above paragraphs and thus is omitted for the sake of the brevity.

Figure 28:
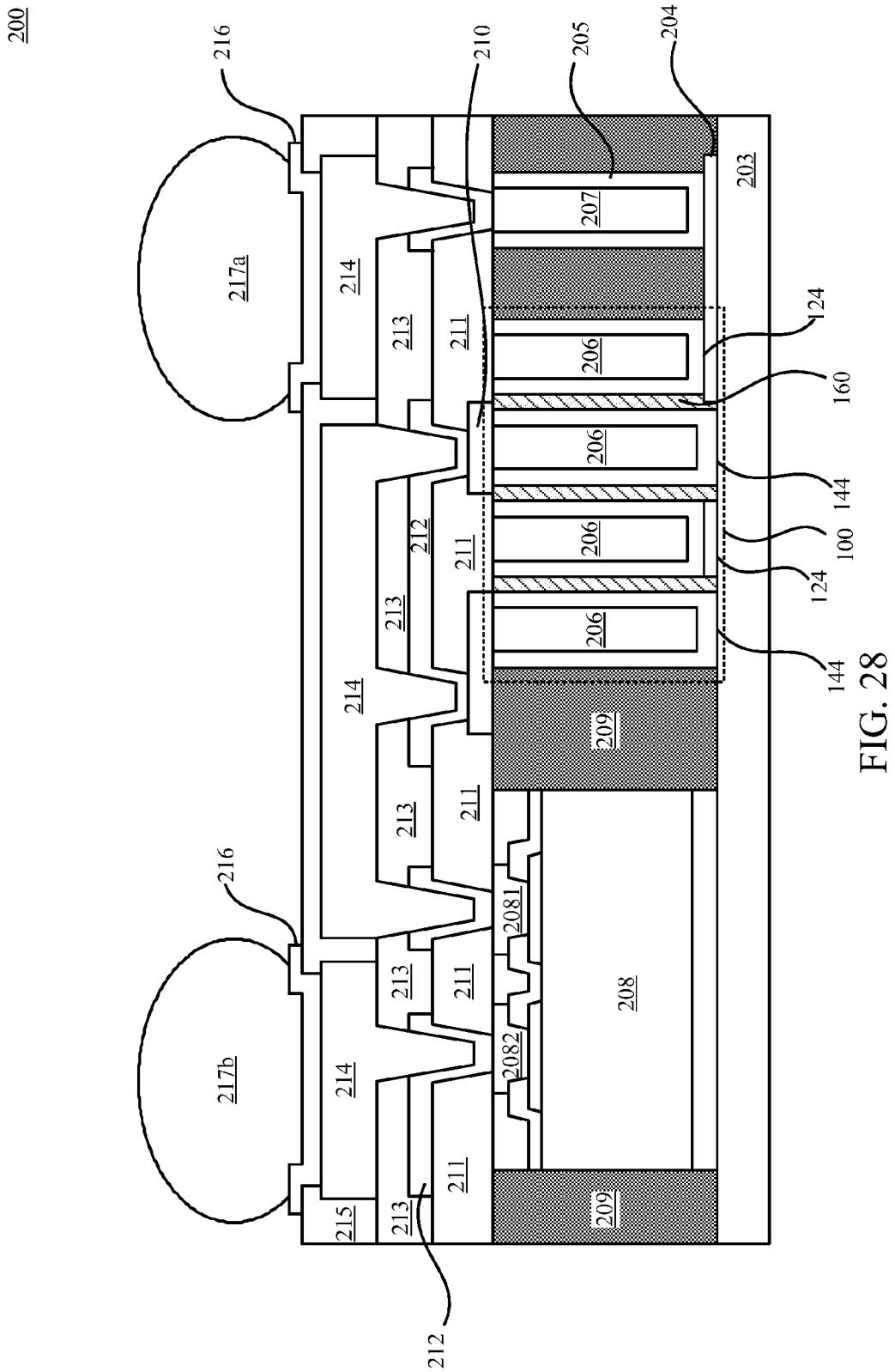
FIG. 28 is a schematic diagram illustrating an Integrated Fan-Out (InFO) package including the semiconductor structure in FIG. 1 in accordance with some embodiments of the present disclosure.

Reference is made to FIG. 28. FIG. 28 is a schematic diagram illustrating another Integrated Fan-Out (InFO) package 200 including the semiconductor structure 100 in FIG. 1 in accordance with alternative embodiments of the present disclosure. With respect to the embodiments of FIG. 20, like elements in FIG. 28 are designated with the same reference numbers for ease of understanding.

Compared with the embodiments shown in FIG. 27, in the embodiments illustratively shown in FIG. 28, the dielectric material 160 and the molding compound MC are different materials. The dielectric material 160 is filled between the vertical conductive structures 124 and the vertical conductive structures 144 in the semiconductor structure 100 to form an insulating structure. For example, in some embodiments, the dielectric constant (or permittivity) value of the dielectric material 160 is greater than that of the molding compound MC. In some embodiments, the molding compound MC is applied in the molding layer outside the semiconductor structure 100 to surround the device die 208, and the molding compound MC has a low-k value, e.g., less than about 3.9, and even less than about 2.5 in other embodiments. In some embodiments, the molding compound MC includes any suitable material including, for example, an epoxy resin, a molding underfill, or the like. Similarly, the manufacturing process of the Integrated Fan-Out (InFO) package 200 illustrated in FIG. 28 is similar to the manufacturing process of the Integrated Fan-Out (InFO) package 200 illustrated in FIG. 20, which is fully described in the above paragraphs and thus is omitted for the sake of the brevity.

In some embodiments, a semiconductor device is disclosed that the semiconductor device includes a device die, a molding layer surrounding the device die, a plurality of first vertical conductive structures formed within the molding layer, and a plurality of second vertical conductive structures formed within the molding layer. The first vertical conductive structures and the second vertical conductive structures are interlaced with each other, and an insulating structure is formed between the first vertical conductive structures and the second vertical conductive structures.

Also disclosed is a method that includes forming a first conductive plane on a substrate; forming a plurality of first vertical conductive structures on the first conductive plane and electrically coupled to the first conductive plane; forming a plurality of second vertical conductive structures on the substrate, in which the first vertical conductive structures and the second vertical conductive structures are interlaced with each other, and an insulating structure is formed between the first vertical conductive structures and the second vertical conductive structures; attaching a device die on the substrate; applying a molding compound in a molding layer overlying the substrate to surround the device die; and forming a second conductive plane on the molding layer, in which the second conductive plane is electrically coupled to the second vertical conductive structures.

Also disclosed is a method that includes forming a capacitor structure on a substrate, in which the capacitor structure includes a plurality of first vertical conductive structures, a plurality of second vertical conductive structures and an insulating structure between the first vertical conductive structures and the second vertical conductive structures; attaching a device die on the substrate; and applying a molding compound in a molding layer overlying the substrate to surround the device die and the capacitor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a device die;
   a molding layer surrounding the device die;
   a plurality of first vertical conductive structures formed within the molding layer;
   a plurality of second vertical conductive structures formed within the molding layer;
   a first polymer layer overlying the molding layer; and
   a first redistribution layer overlying the first polymer layer to form a conductive plane, wherein the conductive plane is electrically coupled to the second vertical conductive structures, wherein the first vertical conductive structures and the second vertical conductive structures are interlaced with each other, and an insulating structure is formed between the first vertical conductive structures and the second vertical conductive structures.

2. The semiconductor device of claim 1, wherein a molding compound is applied in the molding layer to surround the device die, and a dielectric material is applied in the molding layer to form the insulating structure.

3. The semiconductor device of claim 2, wherein the dielectric material has a dielectric constant higher than that of the molding compound.

4. The semiconductor device of claim 2, wherein the dielectric material comprises polyimide or polybenzoxazole.

5. The semiconductor device of claim 2, wherein the dielectric material comprises silicon nitride or silicon dioxide.

6. The semiconductor device of claim 2, wherein the dielectric material comprises $ZrO_2$, $Al_2O_3$, HfOx, HfSiOx, ZrTiOx, $TiO_2$, or TaOx.

7. The semiconductor device of claim 2, wherein the dielectric material comprises a $SrRuO_3$-$SrTiO_3$-$SrRuO_3$ structure or a $ZrO_2$-$Al_2O_3$-$ZrO_2$ structure.

8. The semiconductor device of claim 1, wherein the first vertical conductive structures are distributed in a grid pattern, and the second vertical conductive structures are distributed in a grid pattern.

9. The semiconductor device of claim 1, further comprising:
a second polymer layer overlying the first redistribution layer; and
a second redistribution layer overlying the second polymer layer;
wherein the device die and the conductive plane are electrically coupled via the second redistribution layer.

10. A semiconductor device, comprising:
a device die;
a molding layer surrounding the device die;
a plurality of first vertical conductive structures formed within the molding layer and electrically coupled to a first conductive plane;
a plurality of second vertical conductive structures formed within the molding layer and electrically coupled to a second conductive plane;
a first polymer layer overlying the molding layer; and
a first redistribution layer overlying the first polymer layer to form the second conductive plane, wherein an insulating structure is formed between the first vertical conductive structures and the second vertical conductive structures.

11. The semiconductor device of claim 10, wherein the second conductive plane is disposed over the molding layer.

12. The semiconductor device of claim 10, wherein the insulating structure comprises a dielectric material.

13. The semiconductor device of claim 12, wherein the dielectric material has a dielectric constant higher than that of a molding compound applied in the molding layer.

14. The semiconductor device of claim 10, further comprising:
a second polymer layer overlying the first redistribution layer;
a second redistribution layer overlying the second polymer layer; and
a third polymer layer overlying the second redistribution layer.

15. A semiconductor device, comprising:
a device die;
a capacitor structure, comprising:
a plurality of first vertical conductive structures;
a plurality of second vertical conductive structures; and
an insulating structure between the first vertical conductive structures and the second vertical conductive structures;
a molding compound in a molding layer surrounding the capacitor structure and the device die;
a first polymer layer overlying the molding layer; and
a first redistribution layer overlying the first polymer layer to form a second conductive plane, wherein the second conductive plane is electrically coupled to the second vertical conductive structures.

16. The semiconductor device of claim 15, wherein the insulating structure comprises a dielectric material.

17. The semiconductor device of claim 16, wherein the dielectric material has a dielectric constant higher than that of the molding compound.

18. The semiconductor device of claim 15, further comprising:
a backside redistribution layer overlying a substrate to form a first conductive plane;
wherein the first conductive plane is electrically coupled to the first vertical conductive structures.

19. The semiconductor device of claim 18, wherein the backside redistribution layer is embedded in the molding layer.

20. The semiconductor device of claim 10, further comprising:
a backside redistribution layer underlying the molding layer to form the first conductive plane.

* * * * *